US007465996B2

(12) United States Patent
Satou et al.

(10) Patent No.: US 7,465,996 B2
(45) Date of Patent: Dec. 16, 2008

(54) SEMICONDUCTOR DEVICE AND METHOD FOR FABRICATING THE SAME

(75) Inventors: Yoshihiro Satou, Hyogo (JP); Chiaki Kudou, Hyogo (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 11/491,930

(22) Filed: Jul. 25, 2006

(65) Prior Publication Data

US 2007/0057331 A1 Mar. 15, 2007

(30) Foreign Application Priority Data

Sep. 15, 2005 (JP) ............................ 2005-269220

(51) Int. Cl.
*H01L 29/76* (2006.01)

(52) U.S. Cl. ...................... 257/388; 257/384; 257/393; 257/382; 257/E29.161

(58) Field of Classification Search ................ 257/388, 257/E29.161
See application file for complete search history.

(56) References Cited

U.S. PATENT DOCUMENTS 5,739,573 A * 4/1998 Kawaguchi ................. 257/384
2006/0163662 A1* 7/2006 Kinoshita et al. ........... 257/369

FOREIGN PATENT DOCUMENTS

JP 2000-252462 9/2000

OTHER PUBLICATIONS

Aime, D., et al. "Work function tuning through dopant scanning and related effects in Ni Fully silicided gate of sub-45nm nodes CMOS" IEEE Tech. Digest, p. 87-90 (2004).
Kittl, J., et al. "Scalability of Ni FUSI gate processes: phase and Vt control to 30nm gate lengths" Symposium on VLSI Technology Digest of Technical Papers, p. 72-73 (2005).

* cited by examiner

*Primary Examiner*—Tu-Tu V Ho
(74) *Attorney, Agent, or Firm*—McDermott Will & Emery LLP

(57) ABSTRACT

A semiconductor device includes: a semiconductor substrate divided into a first region and a second region; a first MIS transistor formed in the first region of the semiconductor substrate and including a stack of a first gate insulating film and a fully-silicided first gate electrode; and a second MIS transistor formed in the second region of the semiconductor substrate and including a stack of a second gate insulating film and a fully-silicided second gate electrode. The second gate electrode has a gate length larger than that of the first gate electrode. A middle portion in the gate length direction of the second gate electrode has a thickness smaller than the thickness of the first gate electrode.

11 Claims, 17 Drawing Sheets

52

A
B 106
105
104
102
103
100
101

107A
106A
105A
104A
106B
105B
104B
107B
102
103
100
108
108
101
108
108

106A
109
109
106B
109
109
105A
105B
102
103
100
110 108 104A 110
101
110 108 104B
108 110

106A
109
109
111
109
106B
109
105A
105B
111
111
102
103
100
110 108
110
101
110 108
108 110

113G
107A
107B
109
109
109
109
106A
105A
106B
105B
112
102
103
100
110 108
110
101
110 108
108 110

SEMICONDUCTOR DEVICE AND METHOD FOR FABRICATING THE SAME

CROSS-REFERENCE TO RELATED APPLICATION

This application claims priority under 35 U.S.C. § 119 on Patent Application No. 2005-269220 filed in Japan on Sep. 15, 2005, the entire contents of which are hereby incorporated by reference.

BACKGROUND OF THE INVENTION

The present invention relates to semiconductor devices and methods for fabricating the devices, and particularly relates to semiconductor devices including fully-silicided gate electrodes and methods for fabricating the devices.

With recent increase in the integration degree and speed of semiconductor integrated circuit devices and expansion of the functionality thereof, studies using metal materials for gate electrodes have been intensively conducted. As candidates for metal materials, metal nitride, dual metal made of two types of pure metals having different work functions and fully-silicided (FUSI) materials formed by changing whole silicon into metal silicide are known. Among these, attention is given on FUSI materials as a promising technique because current silicon processing techniques are still used for the FUSI materials.

A structure of a metal-oxide-semiconductor field effect transistor (MOSFET) using full silicidation and a method for the MOSFET is disclosed in D. Aime et al., IEDM Tech. Digest, p. 87 (2004) and J. A. Kittl et al., Symp. of VLSI Technology, p. 72 (2005).

FIG. 16 illustrates a cross-sectional structure of a conventional semiconductor device including a FUSI gate electrode structure. FIGS. 17A through 17D illustrate cross-sectional structures in respective process steps of a method for fabricating the semiconductor device illustrated in FIG. 16 in the order of fabrication.

The method for fabricating the conventional FUSI semiconductor device will be described. First, as illustrated in FIG. 17A, an isolation region 2 is selectively formed in an upper portion of a semiconductor substrate 1 of silicon to electrically separate elements (i.e., transistors). Then, a p-well 3 is formed by ion implantation in an upper portion of the semiconductor substrate 1. Subsequently, a gate insulating film 4 is formed on the semiconductor substrate 1, and then a polysilicon film 5 forming a gate electrode and a silicon oxide film 6 protecting the polysilicon film 5 are deposited in this order on the gate insulating film 4. Thereafter, photolithography and dry etching are performed, thereby patterning the gate insulating film 4, the polysilicon film 5 and the silicon oxide film 6 so that a gate-electrode formation film 7 is formed out of the polysilicon film 5 and the silicon oxide film 6. Subsequently, ion implantation is performed using the gate-electrode formation film 7 as a mask, thereby forming shallow source/drain doped layers 8 in the p-well 3.

Next, as illustrated in FIG. 17B, an insulating film is deposited over the semiconductor substrate 1 to cover the gate-electrode formation film 7 and the deposited insulating film is etched back, thereby forming insulating sidewalls 9 on both sides of the gate-electrode formation film 7. Subsequently, ion implantation is performed using the gate-electrode formation film 7 and the sidewalls 9 as masks, thereby forming deep source/drain doped layers 10 in the p-well 3 below both sides of the gate-electrode formation film 7. Thereafter, a nickel film (not shown) is deposited over the semiconductor substrate 1 and then is subjected to annealing, thereby causing silicon forming the deep source/drain doped layers 10 in the semiconductor substrate 1 and the nickel film in contact with this silicon portion to react with each other. Accordingly, silicon regions in upper portions of the source/drain doped layers 10 are silicided. Thereafter, an unreacted portion of the nickel film is removed, thereby selectively forming nickel silicide layers 11 in the upper portions of the source/drain doped layers 10. Then, an interlayer insulating film 12 made of silicon oxide is deposited over the semiconductor substrate 1. Thereafter, the interlayer insulating film 12 is planalized by chemical mechanical polishing (CMP) so that the surface of the interlayer insulating film 12 is at the same level as the upper ends of the sidewalls 9.

Then, as illustrated in FIG. 17C, the silicon oxide film 6 is etched so that the polysilicon film 5 under the silicon oxide film 6 is exposed. Subsequently, a metal film 13 made of, for example, nickel is deposited over the interlayer insulating film 12, the sidewalls 9 and the polysilicon film 5 exposed between the sidewalls 9.

Thereafter, as illustrated in FIG. 17D, annealing is performed to cause a reaction between the polysilicon film 5 included in the gate-electrode formation film and the metal film 13 in contact with the polysilicon film 5, thereby forming a FUSI gate electrode 14 made of nickel silicide. In this manner, the conventional semiconductor device illustrated in FIG. 16 is completed.

As a result of full silicidation of the gate electrode 14 described above, the resistance of the gate electrode 14 is reduced, and the device is allowed to operate at higher speed.

However, the conventional semiconductor device and the conventional method for fabricating the device have a problem in which the gate electrode is not fully silicided and unreacted polysilicon remains if a FUSI electrode whose gate length or gate area is large is used as the gate electrode 14. In addition, there also arises another problem in which the metal film 13 and the polysilicon film 5 forming the gate-electrode formation film 7 excessively react with each other to form silicide having partially different compositions in the gate electrode.

FIGS. 18A and 18B illustrate problems occurring in the FUSI gate electrode 14. In FIG. 18A, a transistor in a first region A is a transistor having a relatively small gate length (gate area) and is, for example, a transistor forming an internal circuit such as a logic circuit or a static random access memory (SRAM) circuit. On the other hand, a transistor in a second region B is a transistor having a gate length (gate area) larger than that of the transistor in the first region A and is, for example, a transistor forming an input/output circuit.

As illustrated in FIG. 18A, in depositing the metal film 13 over the exposed polysilicon film 5, $t_{Metal}/t_{Si}$, which is the ratio of the thickness $t_{Metal}$ of the metal film to the thickness $t_{Si}$ of the polysilicon film 5 in a middle portion of the gate electrode in the second region B, is smaller than $t_{Metal}/t_{Si}$, which is the ratio of the thickness $t_{Metal}$ of the metal film to the thickness $t_{Si}$ of the polysilicon film 5 in the first region A. This is conspicuous when the value twice as large as the gate length in the first region A is smaller than the thickness of the metal film 13 and the value twice as large as the gate length in the second region B is larger than the thickness of the metal film 13.

As a result, as illustrated in FIG. 18B, the gate electrode 14A in the first region A is fully silicided, whereas the metal film 13 is insufficiently supplied in a middle portion of the polysilicon film 5 in the second region B because of the large gate length or area of the gate electrode 14B. Accordingly, as illustrated in FIG. 18B, an unreacted region 5*a* is likely to be formed in a middle lower portion of the polysilicon film 5. If such an unreacted region 5*a* is formed in the gate electrode 14B, characteristics such as the threshold voltage vary, so that desired transistor characteristics are not obtained.

In addition, the metal film 13 is also deposited on the inner walls of the sidewalls 9 in the second region B, so that the thickness of the metal film 13 deposited on the inner walls is larger than that of the other part. Accordingly, metal is excessively supplied to portions of the polysilicon film 5 in contact with the sidewalls 9, so that metal-rich portions 16 having a silicide composition different from that in the middle portion of the gate electrode 14B are formed. If such metal-rich portions 16 are formed in the gate electrode 14B, the gate resistance varies and circuit operation is adversely affected.

SUMMARY OF THE INVENTION

It is therefore an object of the present invention to prevent an unreacted polysilicon region or a region having locally different silicide compositions from being formed in a gate electrode of a transistor because of pattern dependence of, for example, the gate length or the gate area in full silicidation of the gate electrode.

To achieve the object, a semiconductor device according to the present invention has a configuration in which a first transistor having a relatively small gate length (gate area) and formed in, for example, an internal circuit region and a second transistor having a relatively large gate length (gate area) and formed in, for example, an input/output circuit region are provided and the thickness of a middle portion of the gate electrode of the second transistor is smaller than the thickness of the gate electrode of the first transistor.

Specifically, a semiconductor device according to the present invention includes: a semiconductor substrate divided into a first region and a second region; a first MIS transistor formed in the first region of the semiconductor substrate and including a stack of a first gate insulating film and a fully-silicided first gate electrode; and a second MIS transistor formed in the second region of the semiconductor substrate and including a stack of a second gate insulating film and a fully-silicided second gate electrode. The second gate electrode has a gate length larger than that of the first gate electrode. A middle portion in a gate length direction of the second gate electrode has a thickness smaller than the thickness of the first gate electrode.

In the semiconductor device of the present invention, the second MIS transistor having a gate length larger than that of the first MIS transistor includes a second gate electrode whose thickness in a middle portion in the gate length direction is smaller than that of the first gate electrode of the first MIS transistor, so that the thickness ratio of the metal film to the silicon film before full silicidation is high. Accordingly, no unreacted silicon region remains in the middle portion of the second gate electrode of the second MIS transistor, so that full silicidation is uniformly performed. In the case of a recess shape in cross section, i.e., in a structure in which both ends of the second gate electrode in the gate length direction are thicker than the middle portion thereof, no region having locally different silicide compositions is formed in both ends of the second gate electrode in the gate length direction during silicidation.

In the semiconductor device of the present invention, the second gate electrode preferably has a flat upper surface.

In the semiconductor device of the present invention, the second gate electrode preferably has a recess in cross section in the gate length direction.

In the semiconductor device of the present invention, sidewalls made of an insulating film are preferably formed on both sides of each of the first gate electrode and the second gate electrode.

Preferably, in the semiconductor device of the present invention, the first MIS transistor has a first impurity layer formed in the first region below both sides of the first gate electrode, and the second MIS transistor includes a second impurity layer formed in the second region below both sides of the second gate electrode.

In the semiconductor device of the present invention, the first MIS transistor and the second MIS transistor are preferably MIS transistors of an identical conductivity type.

A first method for fabricating a semiconductor device according to the present invention includes the steps of: (a) forming a gate insulating film, a silicon film and a protective film in this order over a semiconductor substrate divided into a first region and a second region; (b) patterning at least the protective film and the silicon film, thereby forming a first gate-electrode formation film including a first protective film and a first gate silicon film formed out of the protective film and the silicon film, respectively, in the first region, and also forming a second gate-electrode formation film including a second protective film and a second gate silicon film formed out of the protective film and the silicon film, respectively, in the second region, the second gate-electrode formation film having a gate length larger than that of the first gate-electrode formation film; (c) forming sidewalls of an insulating film on side faces of the first gate-electrode formation film and the second gate-electrode formation film: (d) forming an impurity layer in the first region and the second region of the semiconductor substrate using, as masks, the first gate-electrode formation film and the second gate-electrode formation film provided with the sidewalls; (e) removing the first protective film and the second protective film after the step (d), thereby exposing the first gate silicon film and the second gate silicon film; (f) reducing the thickness of at least a middle portion in a gate length direction of the second gate silicon film so that the thickness is smaller than the thickness of the first gate silicon film, after the step (e); and (g) forming a metal film on the first gate silicon film and the second gate silicon film and then performing heat treatment on the metal film after the step (f), thereby fully siliciding the first gate silicon film and the second gate silicon film.

With the first method, in the step (f), at least the middle portion of the second gate silicon film in the gate length direction is thinner than the first gate silicon film, so that the thickness ratio of the metal film to the silicon film in the second gate-electrode formation film before full silicidation is increased to a value approximately equal to that in the first gate-electrode formation film. Accordingly, no unreacted silicon region remains in the middle portion of the second gate electrode of the second MIS transistor, so that full silicidation is uniformly performed. In the case of a recess shape in cross section, i.e., in a structure in which both ends of the second gate electrode in the gate length direction are thicker than the middle portion thereof, no region having locally different silicide compositions is formed in both ends of the second gate electrode in the gate length direction during silicidation.

In the first method, in the step (f), etching is preferably performed on the entire second gate silicon film so that the entire second gate silicon film has a thickness smaller than that of the first gate silicon film.

In the first method, in the step (f), only the middle portion in the gate length direction of the second gate silicon film is preferably selectively etched so that the middle portion of the second gate silicon film has a thickness smaller than that of the first gate silicon film.

A second method for fabricating a semiconductor device according to the present invention includes the steps of: (a) forming a gate insulating film on a semiconductor substrate divided into a first region and a second region; (b) forming a first silicon film on a portion of the gate insulating film located in the first region and also forming a second silicon film on a portion of the gate insulating film located in the second region, the second silicon film having a thickness smaller than that of the first silicon film; (c) forming a protective film having a planarized surface on the first silicon film and the second silicon film, after the step (b); (d) patterning at least the protective film, the first silicon film and the second silicon film, thereby forming a first gate-electrode formation film including a first protective film and a first gate silicon film formed out of the protective film and the first silicon film, respectively, in the first region, and also forming a second gate-electrode formation film including a second protective film and a second gate silicon film formed out of the protective film and the second silicon film, respectively, in the second region, the second gate-electrode formation film having a gate length larger than that of the first gate-electrode formation film; (e) forming sidewalls of an insulating film on side faces of the first gate-electrode formation film and the second gate-electrode formation film: (f) forming an impurity layer in the first region and the second region of the semiconductor substrate using, as masks, the first gate-electrode formation film and the second gate-electrode formation film provided with the sidewalls; (g) selectively removing the first protective film and the second protective film after the step (f), thereby exposing the first gate silicon film and the second gate silicon film; and (h) forming a metal film on the first gate silicon film and the second gate silicon film and then performing heat treatment on the metal film after the step (g), thereby fully siliciding the first gate silicon film and the second gate silicon film.

With the second method, in the step (b), a second silicon film having a thickness smaller than that of a first silicon film is formed on a gate insulating film in a second region, and then in the step (d), a first gate-electrode formation film is formed in a first region and a second gate-electrode formation film having a gate length larger than that of the first gate-electrode formation film is formed in the second region, so that the thickness ratio of the metal film to the silicon film in the second gate-electrode formation film before full silicidation is increased to a value approximately equal to that in the first gate-electrode formation film. Accordingly, no unreacted silicon region remains in the middle portion of the second gate electrode of the second MIS transistor, so that full silicidation is uniformly performed.

In the second method, it is preferable that in the step (b), the first silicon film is formed over the entire surface of the semiconductor substrate and then a portion of the first silicon film located in the second region is selectively etched, thereby forming the second silicon film.

In the second method, it is preferable that in the step (b), a silicon film is selectively formed on the portion of the gate insulating film located in the first region, and then the second silicon film is formed on the silicon film and the portion of the gate insulating film located in the second region, thereby forming the first silicon film including the silicon film and the second silicon film on the portion of the gate insulating film in the first region.

A third method for fabricating a semiconductor device according to the present invention includes the steps of: (a) forming a gate insulating film, a first silicon film and a protective film in this order over a semiconductor substrate divided into a first region and a second region; (b) patterning at least the protective film and the first silicon film, thereby forming a first gate-electrode formation film including a first protective film and a lower-level silicon film formed out of the protective film and the first silicon film, respectively, in the first region, and also forming a second gate-electrode formation film including a second protective film and a second gate silicon film formed out of the protective film and the first silicon film, respectively, in the second region, the second gate-electrode formation film having a gate length larger than that of the first gate-electrode formation film; (c) forming sidewalls of an insulating film on side faces of the first gate-electrode formation film and the second gate-electrode formation film: (d) forming an impurity layer in the first region and the second region of the semiconductor substrate using, as masks, the first gate-electrode formation film and the second gate-electrode formation film provided with the sidewalls; (e) selectively removing the first protective film after the step (d), thereby exposing the lower-level silicon film; (f) selectively forming an upper-level silicon film on the lower-level silicon film after the step (e), thereby forming a first gate silicon film including the lower-level silicon film and the upper-level silicon film; (g) selectively removing the second protective film after the step (f), thereby exposing the second gate silicon film; and (h) forming a metal film on the first gate silicon film and the second gate silicon film and then performing heat treatment on the metal film after the step (g), thereby fully siliciding the first gate silicon film and the second gate silicon film.

With the third method, in the step (b), a second gate-electrode formation film having a gate length larger than that of a first gate-electrode formation film is formed in a second region, and then in the step (f), an upper-level silicon film is selectively formed on a lower-level silicon film and a first gate silicon film including the lower-level silicon film and the upper-level silicon film is formed, so that the thickness ratio of the metal film to the silicon film in the second gate-electrode formation film before full silicidation is increased to a value approximately equal to that in the first gate-electrode formation film. Accordingly, no unreacted silicon region remains in the middle portion of the second gate electrode of the second MIS transistor, so that full silicidation is uniformly performed.

A fourth method for fabricating a semiconductor device according to the present invention includes the steps of: (a) forming a gate insulating film, a first silicon film and a protective film in this order over a semiconductor substrate divided into a first region and a second region; (b) patterning at least the protective film and the first silicon film, thereby forming a first gate-electrode formation film including a first protective film and a first lower-level silicon film formed out of the protective film and the first silicon film, respectively, in the first region, and also forming a second gate-electrode formation film including a second protective film and a second lower-level silicon film formed out of the protective film and the first silicon film, respectively, in the second region, the second gate-electrode formation film having a gate length larger than that of the first gate-electrode formation film; (c) forming sidewalls of an insulating film on side faces of the first gate-electrode formation film and the second gate-electrode formation film: (d) forming an impurity layer in the first region and the second region of the semiconductor substrate using, as masks, the first gate-electrode formation film and the second gate-electrode formation film provided with the sidewalls; (e) removing the first protective film and a portion of the second protective film after the step (d), thereby exposing the first lower-level silicon film and a portion of the second lower-level silicon film; (f) selectively forming a first upper-level silicon film over the entire surface of the first lower-level silicon film to form a first gate silicon film including the first lower-level silicon film and the first upper-level silicon film and also selectively forming a second upper-level silicon film on a portion of the second lower-level silicon film to form a second gate silicon film including the second lower-level silicon film and the second upper-level silicon film, after the step (e); and (g) forming a metal film on the first gate silicon film and the second gate silicon film and then performing heat treatment on the metal film after the step (f), thereby fully siliciding the first gate silicon film and the second gate silicon film.

With the fourth method, in the step (b), a second gate-electrode formation film having a gate length larger than that of a first gate-electrode formation film is formed in a second region, and then in the step (f), a first upper-level silicon film is selectively formed on the entire surface of a first lower-level silicon film to form a first gate silicon film including the first lower-level silicon film and the first upper-level silicon film and a second upper-level silicon film is selectively formed on a portion of a second lower-level silicon film to form a second gate silicon film including the second lower-level silicon film and a second upper-level silicon film, so that the thickness ratio of the metal film to the silicon film before full silicidation in the second gate-electrode formation film is increased to a value approximately equal to that in the first gate-electrode formation film. Accordingly, no unreacted silicon region remains in the middle portion of the second gate electrode of the second MIS transistor, so that full silicidation is uniformly performed. In addition, a second silicon film deposited on the second gate-electrode formation film remains on the inner wall of sidewalls during etch-back, so that both ends of the second gate-electrode formation film in the gate length direction are thicker than a middle portion thereof to form a recess shape in cross section. As a result, no region having locally different silicide compositions is formed in both ends of the second gate electrode in the gate length direction during silicidation.

In the fourth method, in the step (e), the entire protective film included in the second gate-electrode formation film is preferably removed.

In the fourth method, it is preferable that in the step (e), both end portions in a gate length direction of the second protective film included in the second gate-electrode formation film are selectively removed, and the method further includes the step of removing the remaining portion of the second protective film after the step (f) and before the step (g).

Preferably, the first through fourth methods further include the step of forming an interlayer insulating film over the first region and the second region to cover the first protective film and the second protective film therewith, and then planarizing an upper surface of the interlayer insulating film so that upper surfaces of the first protective film and the second protective film are exposed, between the step of forming the impurity layer and the step of removing the first protective film, and an etch rate of the interlayer insulating film is lower than that of each of the first protective film and the second protective film.

A fifth method for fabricating a semiconductor device according to the present invention includes the steps of: (a) forming a gate insulating film, a silicon film and a protective film in this order over a semiconductor substrate divided into a first region and a second region; (b) patterning at least the protective film and the silicon film, thereby forming a first gate-electrode formation film including a first protective film and a first gate silicon film formed out of the protective film and the silicon film, respectively, in the first region, and also forming a second gate-electrode formation film including a second protective film and a second gate silicon film formed out of the protective film and the silicon film, respectively, in the second region, the second gate-electrode formation film having a gate length larger than that of the first gate-electrode formation film; (c) forming sidewalls of an insulating film on side faces of the first gate-electrode formation film and the second gate-electrode formation film: (d) forming an impurity layer in the first region and the second region of the semiconductor substrate using, as masks, the first gate-electrode formation film and the second gate-electrode formation film provided with the sidewalls; (e) forming an interlayer insulating film over the first region and the second region to cover the first protective film and the second protective film therewith, and then removing the first protective film, the second protective film and the interlayer insulating film by polishing, thereby exposing the first gate silicon film and the second gate silicon film and forming an upper surface of the second gate silicon film to have a recess in cross section; (f) etching back the first gate silicon film and the second gate silicon film after the step (e); and (g) forming a metal film on the first gate silicon film and the second gate silicon film and then performing heat treatment on the metal film after the step (f), thereby fully siliciding the first gate silicon film and the second gate silicon film.

With the fifth method, in the step (b), a second gate-electrode formation film having a gate length larger than that of a first gate-electrode formation film is formed in a second region, and then in the step (e), an interlayer insulating film is formed over first and second regions to cover a protective film, and then the protective film and the interlayer insulating film are removed by polishing so that a first gate silicon film and a second gate silicon film are exposed and the upper surface of the second gate silicon film is formed to have a recess in cross section, so that the thickness ratio of the metal film to the silicon film in a second gate-electrode formation film before full silicidation is increased to a value approximately equal to that in a first gate-electrode formation film. Accordingly, no unreacted silicon region remains in a middle portion of the second gate electrode of the second MIS transistor, so that full silicidation is uniformly performed. In addition, both ends of the second gate-electrode formation film in the gate length direction are thicker than the middle portion thereof to form a recess shape in cross section. As a result, no region having locally different silicide compositions is formed in both ends of the second gate electrode in the gate length direction during silicidation.

The first through fifth methods preferably further include the step of forming an extension impurity layer in the first region and the second region of the semiconductor substrate using the first gate-electrode formation film and the second gate-electrode formation film as masks, between the step of patterning the first gate-electrode formation film and the second gate-electrode formation film and the step of forming the sidewalls.

The first through fifth methods preferably further include the step of siliciding an upper portion of the impurity layer between the step of forming the impurity layer and the step of removing the first protective film.

DETAILED DESCRIPTION OF THE INVENTION

Embodiment 1

A first embodiment of the present invention will be described with reference to the drawings.

Figure 1:
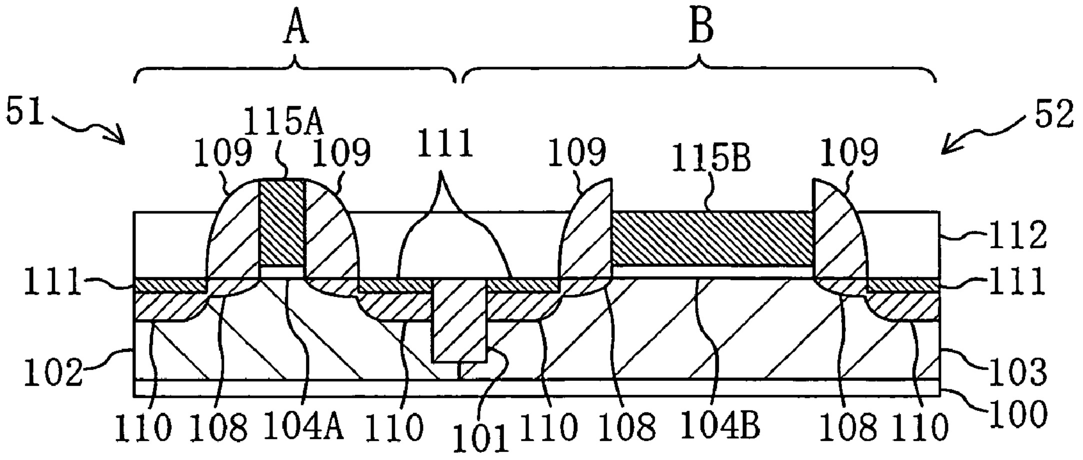
FIG. 1 is a cross-sectional view illustrating a structure of a MOSFET which is a semiconductor device according to a first embodiment of the present invention.

FIG. 1 illustrates a cross-sectional structure of a MISFET which is a semiconductor device according to the first embodiment. As illustrated in FIG. 1, the principal surface of a semiconductor substrate 100 made of, for example, silicon (Si) is divided into a first region A and a second region B. The first and second regions A and B herein also refer to regions of the entire structure as shown in FIG. 1, for example. A MIS transistor having a relatively small gate length (gate area), i.e., a first n-MIS transistor 51 forming an internal circuit such as a logic circuit or an SRAM circuit, is formed in the first region A. A MIS transistor having a gate length (gate area) larger than that of the first n-MIS transistor 51, i.e., a second n-MIS transistor 52 forming, for example, an input/output circuit, is formed in the second region B.

A first p-well 102 is formed in the first region A of the semiconductor substrate 100 and a second p-well 103 is formed in the second region B. The first p-well 102 and the second p-well 103 are separated from each other by an isolation region 101 of, for example, shallow trench isolation (STI).

The first n-MIS transistor 51 includes: a first gate insulating film 104A; a fully-silicided (FUSI) first gate electrode 115A formed on the first gate insulating film 104A; sidewalls 109 made of an insulating film and formed on both sides of each of the first gate insulating film 104A and the first gate electrode 115A; shallow n-type source/drain doped layers (extension regions) 108 formed under the sidewalls 109 in the first p-well 102; and deep n-type source/drain doped layers 110 formed below both sides of the n-type source/drain doped layers 108.

As the first n-MIS transistor 51, the second n-MIS transistor 52 includes: a second gate insulating film 104B; a FUSI second gate electrode 115B formed on the second gate insulating film 104B; sidewalls 109 formed on both sides of each of the second gate insulating film 104B and the second gate electrode 115B and made of an insulating film; shallow n-type source/drain doped layers 108 formed under the sidewalls 109 in the second p-well 103; and deep n-type source/drain doped layers 110 formed below both sides of the n-type source/drain doped layers 108.

Nickel silicide layers 111 are formed in upper portions of the deep n-type source/drain doped layers 110 of the first n-MIS transistor 51 and the second n-MIS transistor 52 to reduce the resistance.

A feature of the first embodiment is that the second gate electrode 115B of the second n-MIS transistor 52 has a thickness smaller than that of the first gate electrode 115A of the first n-MIS transistor 51. Accordingly, the thickness ratio of the metal film to the silicon film before full silicidation of the second gate electrode 115B is increased to be substantially equal to that in the first gate electrode 115A. As a result, no unreacted silicon region remains even in a middle portion of the second gate electrode 115B of the second MIS transistor, so that full silicidation is uniformly performed.

Hereinafter, a method for fabricating a semiconductor device having the foregoing structure will be described with reference to the drawings. FIGS. 2A through 2E and FIGS. 3A through 3E illustrate cross-sectional structures in respective process steps of the method for fabricating the semiconductor device of the first embodiment in the order of fabrication.

Figure 2A:
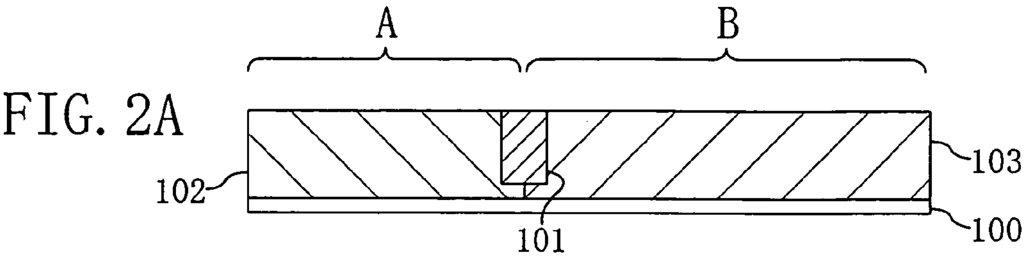
FIGS. 2A through 2E are cross-sectional views illustrating structures in respective process steps of a method for fabricating the semiconductor device of the first embodiment in the order of fabrication.

First, as illustrated in FIG. 2A, an isolation region 101 is selectively formed by, for example, an STI process in an upper portion of a semiconductor substrate 100 made of silicon. Thereafter, ion implantation is performed to form a first p-well 102 in a first region A and a second p-well 103 in a second region B in the semiconductor substrate 100. It should be noted that the order of forming the first p-well 102 and the second p-well 103 is not limited.

Figure 2B:
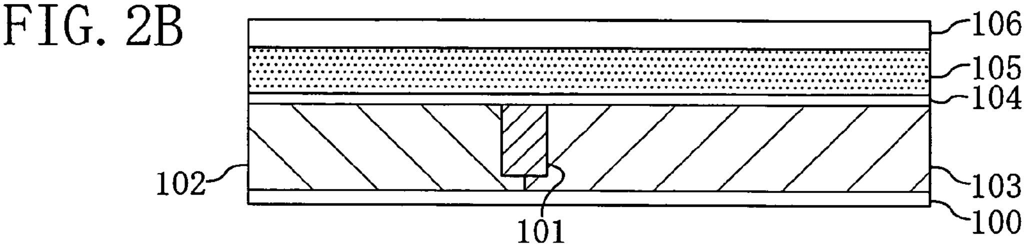

Next, as illustrated in FIG. 2B, on a region of the principal surface of the semiconductor substrate 100 surrounded with the isolation region 101, i.e., a transistor region (active region), a gate-insulating-film formation film 104 made of silicon oxide and having a thickness of 2 nm, for example, is formed by a technique such as dry oxidation, wet oxidation or oxidation using oxygen radical. Thereafter, a polysilicon film 105 for forming a gate electrode is deposited by, for example, chemical vapor deposition (CVD) to a thickness of, for example, 160 nm over the entire surface of the semiconductor substrate 100 including the isolation region 101 and the gate-insulating-film formation film 104. Subsequently, a protective-film formation film 106 having a thickness of, for example, 100 nm and made of silicon oxide is formed by CVD over the polysilicon film 105.

Figure 2C:
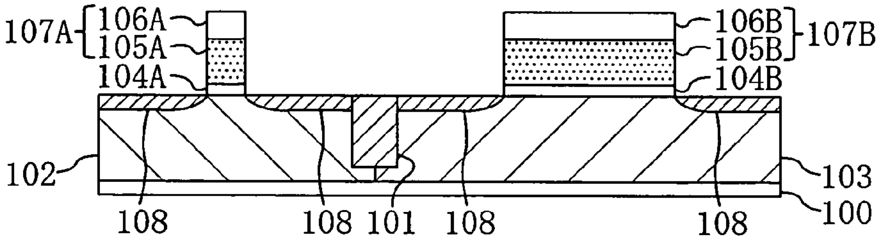

Then, as illustrated in FIG. 2C, the protective-film formation film 106 is patterned into a gate pattern by lithography and dry etching mainly using fluorocarbon in the first region A and the second region B, thereby forming a first protective film 106A and a second protective film 106B out of the protective-film formation film 106. At this time, the width (gate length) of the second protective film 106B in the second region B is larger than that of the first protective film 106A in the first region A. Subsequently, the polysilicon film 105 and the gate-insulating-film formation film 104 are dry etched using the patterned first and second protective films 106A and 106B as masks. In this dry etching, an etching gas containing chlorine or bromine as a main component is used for the polysilicon film 105. In this manner, a first gate-electrode formation film 107A including the patterned first protective film 106A and first polysilicon film 105A is formed in the first region A and a second gate-electrode formation film 107B including the patterned second protective film 106B and second polysilicon film 105B is formed in the second region B. A this time, a first gate insulating film 104A is formed out of the gate-insulating-film formation film 104 in the first region A and a second gate insulating film 104B is formed out of the gate-insulating-film formation film 104 in the second region B. Thereafter, ion implantation using, for example, phosphorus (P) or arsenic (As) as an n-type dopant is performed using the first gate-electrode formation film 107A and the second gate-electrode formation film 107B as masks, thereby forming shallow n-type source/drain doped layers 108 in the first p-well 102 and the second p-well 103.

Figure 2D:
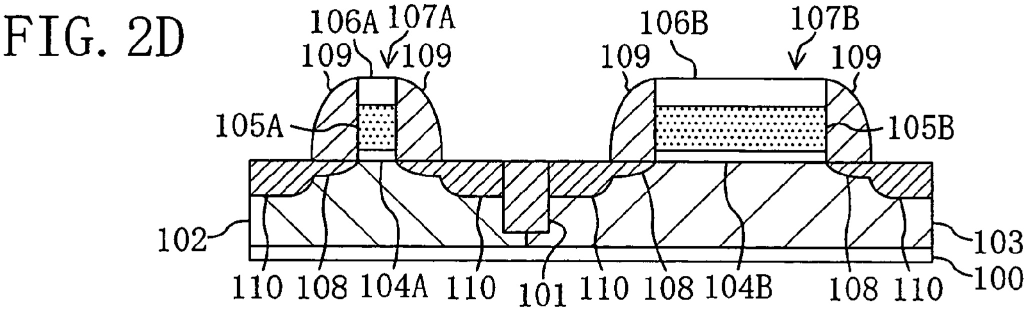

Thereafter, as illustrated in FIG. 2D, a silicon nitride film is deposited by CVD to a thickness of 50 nm over the entire surface of the semiconductor substrate 100 including the gate-electrode formation films 107A and 107B. Then, anisotropic etching using an etching gas containing, for example, fluorocarbon as a main component is performed on the deposited silicon nitride film, thereby forming sidewalls 109 made of a silicon nitride film on both sides of each of the gate-electrode formation films 107A and 107B. Subsequently, ion implantation using phosphorus (P) or arsenic (As) as a dopant is performed using the gate-electrode formation films 107A and 107B provided with the sidewalls 109 as masks. Then, heat treatment for activating the implanted dopant is performed, thereby forming deep n-type source/drain doped layers 110 in the first p-well 102 and the second p-well 103 below both sides of the sidewalls 109 on the gate-electrode formation films 107A and 107B.

Figure 2E:
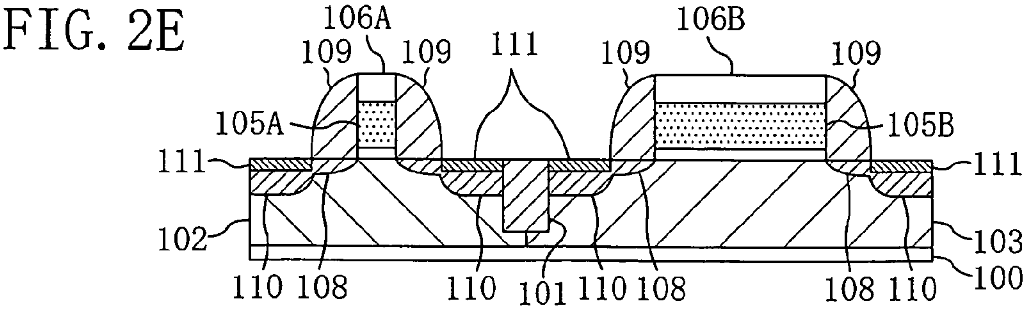

Subsequently, as illustrated in FIG. 2E, a natural oxide film formed on the surfaces of the deep n-type source/drain doped layers 110 is removed. Then, a nickel film (not shown) with a thickness of 20 nm, for example, is deposited over the entire surface of the semiconductor substrate 100 by, for example, sputtering. Thereafter, first rapid thermal annealing (RTA) is performed on the semiconductor substrate 100 at 320° C. in a nitrogen atmosphere, for example, thereby causing silicon forming the semiconductor substrate 100 and nickel in contact with this silicon portion to react with each other. This changes upper portions of the deep n-type source/drain doped layers 110 into nickel silicide. Subsequently, the semiconductor substrate 100 is immersed in an etchant in which hydrochloric acid and a hydrogen peroxide solution, for example, are mixed, thereby removing unreacted nickel films remaining on at least the isolation region 101, the protective films 106A and 106B and the sidewalls 109. Thereafter, second RTA is performed on the semiconductor substrate 100 at a temperature higher than the first RTA, e.g., at 550° C. In this manner, low-resistance nickel silicide layers 111 are formed in respective upper portions of the deep n-type source/drain doped layers 110.

Figure 3A:
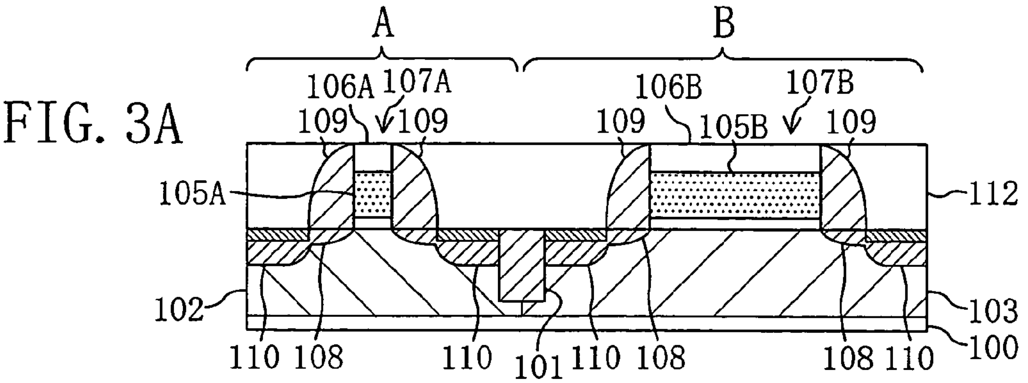
FIGS. 3A through 3E are cross-sectional views illustrating structures in respective process steps of the method for fabricating the semiconductor device of the first embodiment in the order of fabrication.

Then, as illustrated in FIG. 3A, an interlayer insulating film 112 of, for example, a silicon oxide film is formed over the entire surface of the semiconductor substrate 100 to cover the gate-electrode formation films 107A and 107B. Thereafter, the interlayer insulating film 112 is planalized by CMP until the sidewalls 109 and the protective films 106A and 106B are exposed.

Figure 3B:
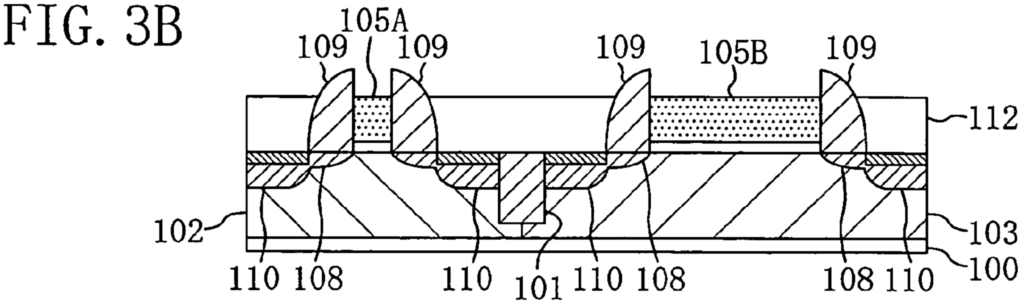

Thereafter, as illustrated in FIG. 3B, the first protective film 106A and the second protective film 106B are etched under etching conditions having selectivities with respect to silicon nitride and polysilicon, thereby exposing the first polysilicon film 105A and the second polysilicon film 105B. To have selectivities with respect to silicon nitride and polysilicon, it is sufficient to use an etchant containing hydrogen fluoride as a main component in the case of wet etching. In the case of dry etching, it is sufficient to use reactive ion etching under conditions in which $C_5F_8$ at a flow rate of 15 ml/min (standard condition), $O_2$ at a flow rate of 18 ml/min (standard condition) and Ar at a flow rate of 950 ml/min (standard condition) are supplied under a pressure of 6.7 Pa with an RF power (T/B) is 1800 W/1500 W at a substrate temperature of 0° C.

In this embodiment, the protective films 106A and 106B and the interlayer insulating film 112 are made of silicon oxide, so that an upper portion of the interlayer insulating film 112 is also etched. Accordingly, the addition of phosphorus (P) or boron (B) to silicon oxide forming the protective-film formation film 106 is preferable because the etch rate becomes higher than that of the interlayer insulating film 112, so that the selectivity with respect to the interlayer insulating film 112 is obtained.

Figure 3C:
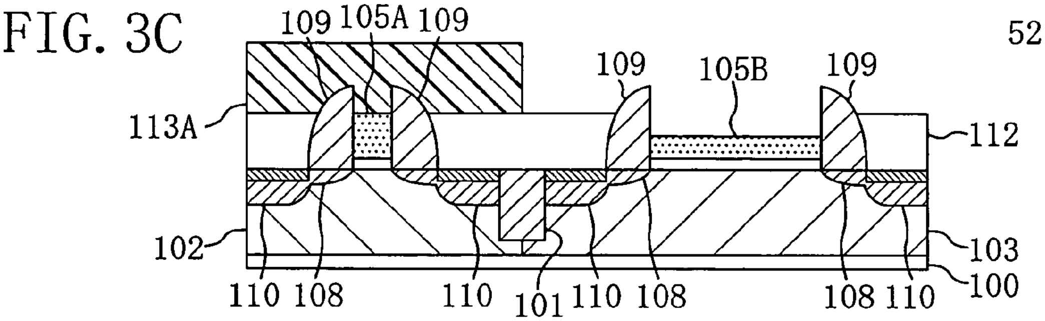

Then, as illustrated in FIG. 3C, a resist pattern 113A is formed on the interlayer insulating film 112 and the sidewalls 109 to cover the first region A, i.e., the first polysilicon film 105A. Subsequently, using the resist pattern 113A as a mask, the second polysilicon film 105B in the second region B is etched under etching conditions having selectivities with respect to silicon nitride and silicon oxide, thereby reducing the thickness of the second polysilicon film 105B to 80 nm. To provide polysilicon with selectivities with respect to silicon nitride and silicon oxide, it is sufficient to use an etchant containing hydrogen fluoride and nitric acid as main components in the case of wet etching. In the case of dry etching, it is sufficient to use an etching gas containing chlorine or bromine as a main component.

Figure 3D:
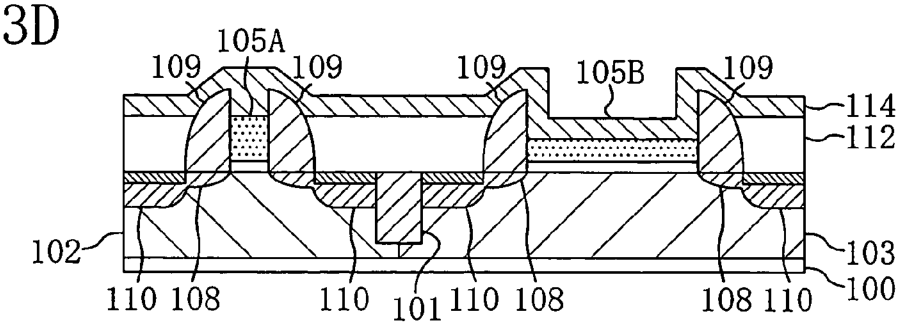
Figure 3E:
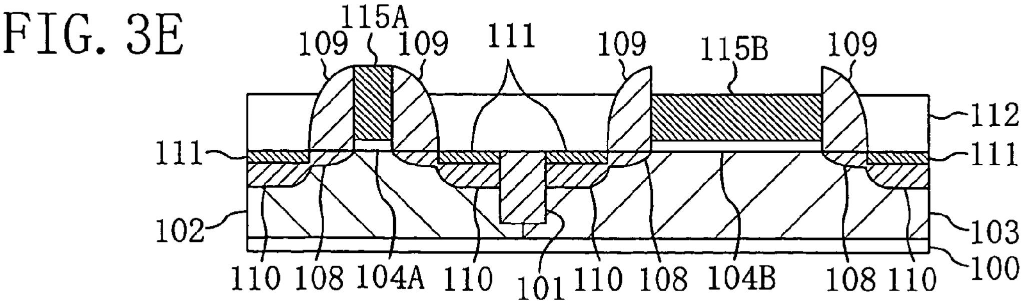

Thereafter, as illustrated in FIG. 3D, the resist pattern 113A is removed, and then a metal film 114 of nickel is deposited by sputtering to a thickness of, for example, 50 nm over the entire surface including the interlayer insulating film 112, the sidewalls 109 and the polysilicon films 105A and 105B. Subsequently, third RTA is performed on the semiconductor substrate 100 at 400° C. in a nitrogen atmosphere, for example, to cause the polysilicon films 105A and 105B and the metal film 114 in contact with the polysilicon films 105A and 105B to react with each other, thereby fully siliciding the polysilicon films 105A and 105B. In this manner, as illustrated in FIG. 3E, a (FUSI) first gate electrode 115A and a (FUSI) second gate electrode 115B are formed in the first region A and the second region B, respectively.

As described above, in the first embodiment, the second polysilicon film 105B formed in the second region B is thinner than the first polysilicon film 105A formed in the first region A, so that the thickness ratio of the metal film 114 to the second polysilicon film 105B in the second region B is higher than those in conventional devices. Accordingly, no unreacted polysilicon region remains at least in a middle portion in the gate length direction of the second gate electrode 115B in the second region B, so that full silicidation is uniformly performed. As a result, variations in operation characteristics such as the threshold voltage caused by a remaining unreacted polysilicon region are suppressed, thus obtaining desired transistor characteristics.

Embodiment 2

Hereinafter, a method for fabricating a semiconductor device according to a second embodiment of the present invention will be described with reference to the drawings.

FIGS. 4A through 4D illustrate cross-sectional structures in respective process steps of the method for fabricating a semiconductor device of the second embodiment in the order of fabrication. In FIGS. 4A through 4D, components already illustrated in FIGS. 2A through 2E and FIGS. 3A through 3E are denoted by the same reference numerals and description thereof will be omitted. The same holds for the following embodiments.

In the first embodiment, the second polysilicon film 105B is etched to have a uniform thickness at the process step shown in FIG. 3C, whereas in the second embodiment, selective etching is performed only on a middle portion of a second polysilicon film 105B in the gate length direction.

Figure 4A:
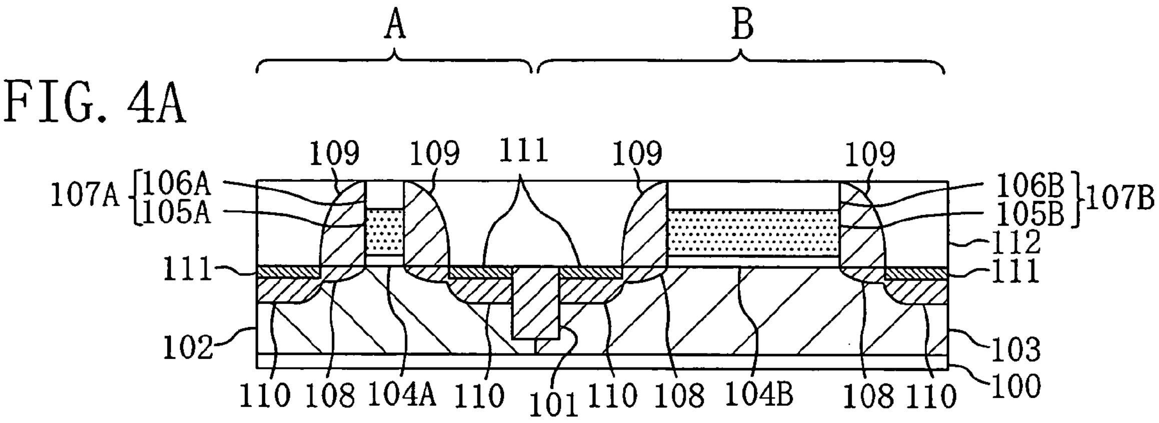
FIGS. 4A through 4D are cross-sectional views illustrating structures in respective process steps of a method for fabricating a semiconductor device according to a second embodiment of the present invention in the order of fabrication.

First, as in the first embodiment, FIG. 4A illustrates a state in which a first gate-electrode formation film 107A provided with sidewalls 109 on both sides thereof is formed in a first region A of a semiconductor substrate 100 and a second gate-electrode formation film 107B provided with sidewalls 109 on both sides thereof and having an area larger than the first gate-electrode formation film 107A is formed in a second region B of the semiconductor substrate 100. Below both sides of the first gate-electrode formation film 107A in a first p-well 102 and both sides of the second gate-electrode formation film 107B in the second p-well 103, shallow n-type source/drain doped layers 108 and deep n-type source/drain doped layers 110 are formed. Nickel silicide layers 111 are formed in upper portions of the deep n-type source/drain doped layers 110. The gate-electrode formation films 107A and 107B including the sidewalls 109 are buried in a planarized interlayer insulating film 112.

Figure 4B:
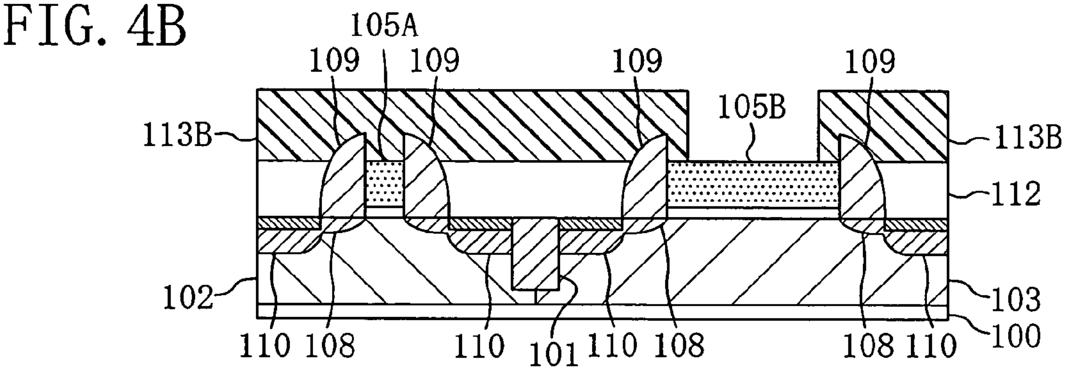

Next, as illustrated in FIG. 4B, a first protective film 106A and a second protective film 106B are etched under etching conditions having selectivities with respect to silicon nitride and polysilicon, thereby exposing a first polysilicon film 105A and a second polysilicon film 105B. Thereafter, a resist pattern 113B is formed on the interlayer insulating film 112 and the sidewalls 109 to cover both sides of each of the first polysilicon film 105A and the second polysilicon film 105B in the gate length direction. This resist pattern 113B covers the entire upper surface of the first polysilicon film 105A and both sides of the upper surface of the second polysilicon film 105B. An opening pattern is formed in a region of the resist pattern 113B located on the upper surface of the second gate electrode 115B except for both sides of the second gate electrode 115B.

Subsequently, etching is performed on a middle portion of the second polysilicon film 105B in the gate length direction using the resist pattern 113B as a mask under etching conditions having selectivities with respect to silicon nitride and silicon oxide, thereby reducing the thickness of the middle portion of the second gate electrode 115B to 80 nm.

Figure 4C:
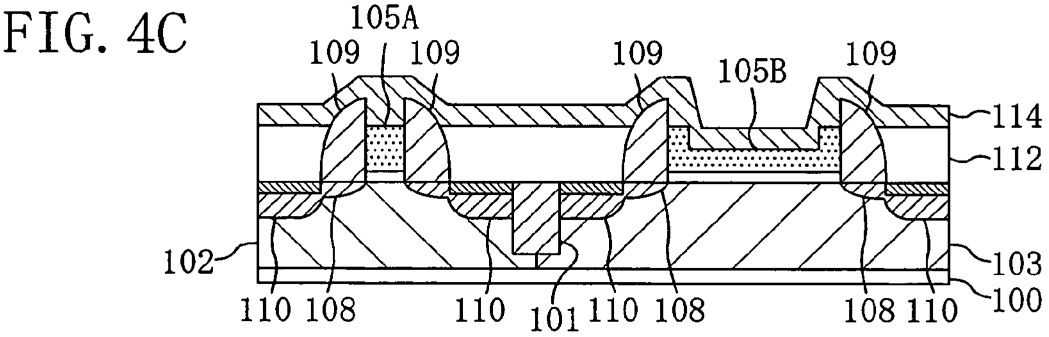
Figure 4D:
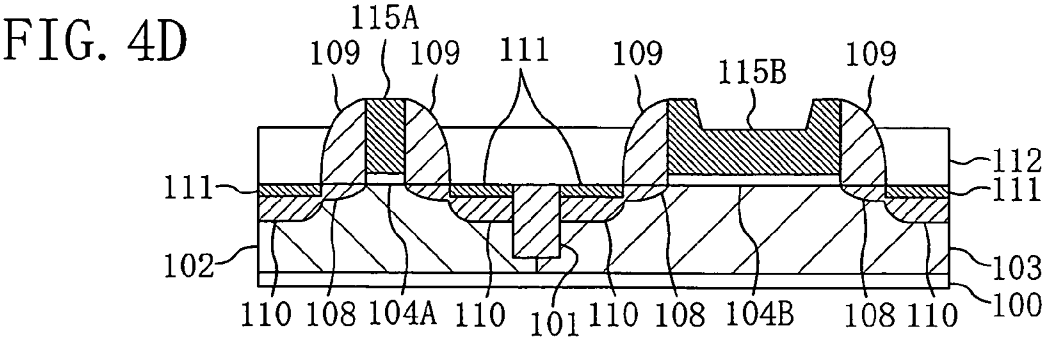

Thereafter, as illustrated in FIG. 4C, the resist pattern 113B is removed, and then a metal film 114 of nickel having a thickness of 50 nm is deposited by sputtering over the entire surface including the interlayer insulating film 112, the sidewalls 109 and the polysilicon films 105A and 105B. Subsequently, RTA is performed on the semiconductor substrate 100 at 400° C. in a nitrogen atmosphere to cause the polysilicon films 105A and 105B and the metal film 114 in contact with the polysilicon films 105A and 105B to react with each other, thereby fully siliciding the polysilicon films 105A and 105B. In this manner, as illustrated in FIG. 4D, a fully-silicided (FUSI) first gate electrode 115A and a FUSI second gate electrode 115B are formed in the first region A and the second region B, respectively.

As described above, in the second embodiment, the second polysilicon film 105B formed in the second region B is thinner than the first polysilicon film 105A formed in the first region A, so that the thickness ratio of the metal film 114 to the second polysilicon film 105B in the second region B is higher than those in conventional devices. Accordingly, no unreacted polysilicon region remains at least in a middle portion in the gate length direction of the second gate electrode 115B in the second region B, so that full silicidation is uniformly performed. As a result, variations in operation characteristics such as the threshold voltage caused by a remaining unreacted polysilicon region are suppressed.

In addition, in the second embodiment, both ends of the second polysilicon film 105B in contact with the sidewalls 109 remain. Accordingly, even if the metal film 114 is thick on the inner walls of the sidewalls 109, the thickness of portions of the second polysilicon film 105B in contact with the sidewalls 109 does not come to be insufficient, so that an excessive supply of nickel atoms forming the metal film 114 near the sidewalls 109 is avoided during full silicidation of the second gate electrode 115B. This prevents a so-called metal-rich FUSI electrode having a silicide composition different from that of a middle portion of the second gate electrode 115B from being formed in both sides of the second gate electrode 115B. As a result, variation of the gate resistance due to a nonuniform silicide composition in the second gate electrode 115B is avoided, thus obtaining desired transistor characteristics.

Embodiment 3

Hereinafter, a method for fabricating a semiconductor device according to a third embodiment of the present invention will be described with reference to the drawings.

FIGS. 5A through 5E and FIGS. 6A through 6E illustrate cross-sectional structures in respective process steps of the method for fabricating a semiconductor device according to the third embodiment in the order of fabrication.

In the third embodiment, the thickness of a polysilicon film included in a second region B is reduced after deposition, i.e., before patterning.

Figure 5A:
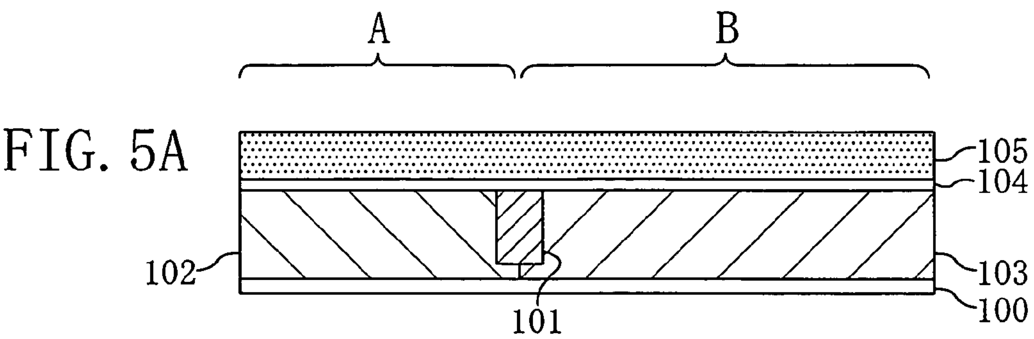
FIGS. 5A through 5E are cross-sectional views illustrating structures in respective process steps of a method for fabricating a semiconductor device according to a third embodiment of the present invention in the order of fabrication.

First, as illustrated in FIG. 5A, an isolation region 101 is formed in an upper portion of the semiconductor substrate 100. Then, a first p-well 102 is formed by ion implantation in a first region A of the semiconductor substrate 100. Subsequently, a second p-well 103 is formed by ion implantation in a second region B of the semiconductor substrate 100. Thereafter, a gate-insulating-film formation film 104 made of silicon oxide and having a thickness of 2 nm is formed by thermal oxidation on an active region of the semiconductor substrate 100. Then, a polysilicon film 105 for forming a gate electrode is deposited by CVD to a thickness of 160 nm over the entire surface of the semiconductor substrate 100 including the isolation region 101 and the gate-insulating-film formation film 104.

Figure 5B:
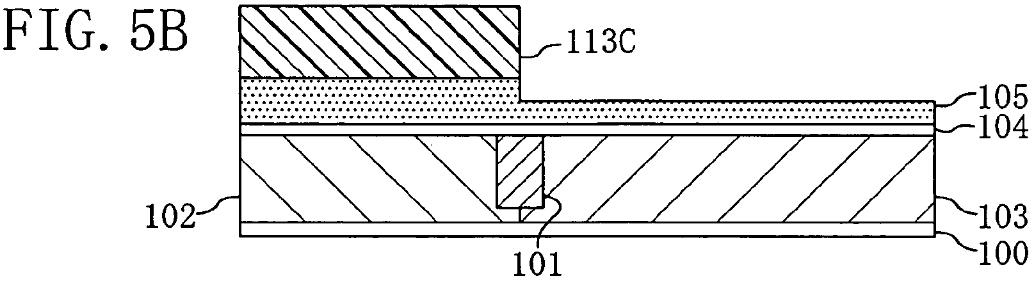

Next, as illustrated in FIG. 5B, a resist pattern 113C is formed on the deposited polysilicon film 105 by lithography to cover the first region A. Then, dry etching or wet etching is performed using the resist pattern 113C as a mask, thereby etching the polysilicon film 105 until the thickness of a portion of the polysilicon film 105 in the second region B is reduced to 80 nm.

Figure 5C:
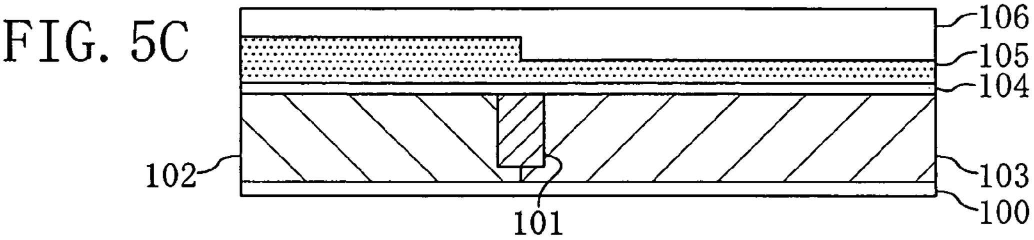

Then, as illustrated in FIG. 5C, the resist pattern 113C is removed, and then a protective-film formation film 106 made of silicon oxide is deposited over the polysilicon film 105 by CVD. Thereafter, the deposited protective-film formation film 106 is polished and planarized by CMP. At this time, a portion of the protective-film formation film 106 in the first region A has a thickness of 100 nm and a portion thereof in the second region B has a thickness of 180 nm.

Figure 5D:
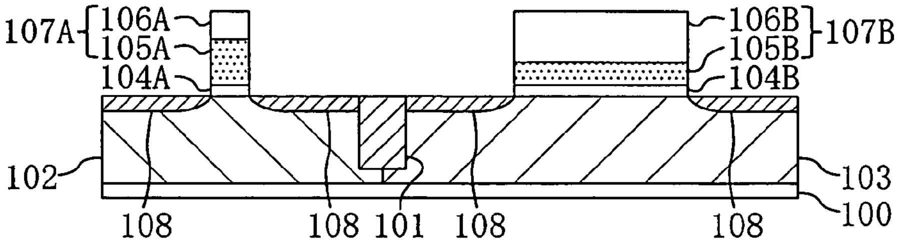

Thereafter, as illustrated in FIG. 5D, the protective-film formation film 106 is patterned into the shape of a gate electrode in each of the first and second regions A and B by lithography and dry etching, thereby forming a first protective film 106A and a second protective film 106B out of the protective-film formation film 106. At this time, the width (gate length) of the second protective film 106B in the second region B is larger than that of the first protective film 106A in the first region A. Subsequently, using the first and second protective films 106A and 106B obtained by patterning as masks, dry etching is performed on the polysilicon film 105 and the gate-insulating-film formation film 104. In this manner, a first gate-electrode formation film 107A including the first protective film 106A and the first polysilicon film 105A is formed in the first region A, whereas a second gate-electrode formation film 107B including the second protective film 106B and the second polysilicon film 105B is formed in the second region B. At this time, a first gate insulating film 104A is formed out of the gate-insulating-film formation film 104 in the first region A, whereas a second gate insulating film 104B is formed out of the gate-insulating-film formation film 104 in the second region B. Subsequently, ion implantation using phosphorus (P) or arsenic (As) as an n-type dopant is performed such that shallow n-type source/drain doped layers 108 are formed in the first p-well 102 and the second p-well 103 with the first gate-electrode formation film 107A and the second gate-electrode formation film 107B used as masks.

Figure 5E:
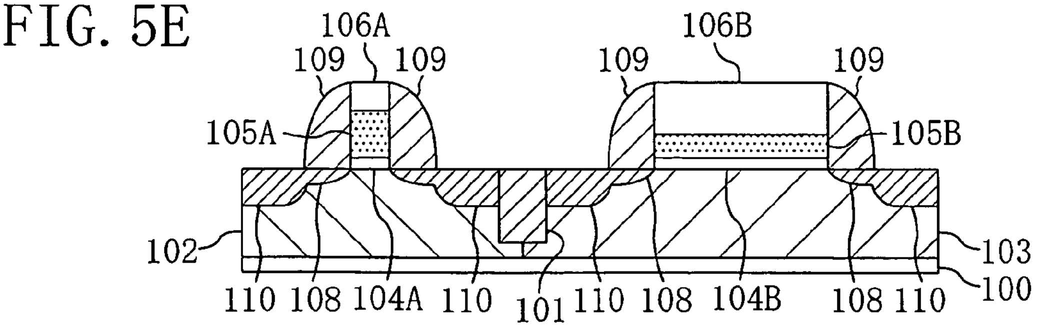

Subsequently, as illustrated in FIG. 5E, a silicon nitride film is deposited by CVD to a thickness of 50 nm over the entire surface of the semiconductor substrate 100 including the gate-electrode formation films 107A and 107B. Then, anisotropic etching is performed on the deposited silicon nitride film, thereby forming sidewalls 109 of a silicon nitride film on both sides of each of the gate-electrode formation films 107A and 107B. Thereafter, ion implantation using phosphorus (P) or arsenic (As) is performed using, as masks, the gate-electrode formation films 107A and 107B provided with the sidewalls 109. Then, with heat treatment for activating the implanted impurity, deep n-type source/drain doped layers 110 are formed in the first p-well 102 and the second p-well 103 below the sides of the sidewalls 109 on the gate-electrode formation films 107A and 107B.

Figure 6A:
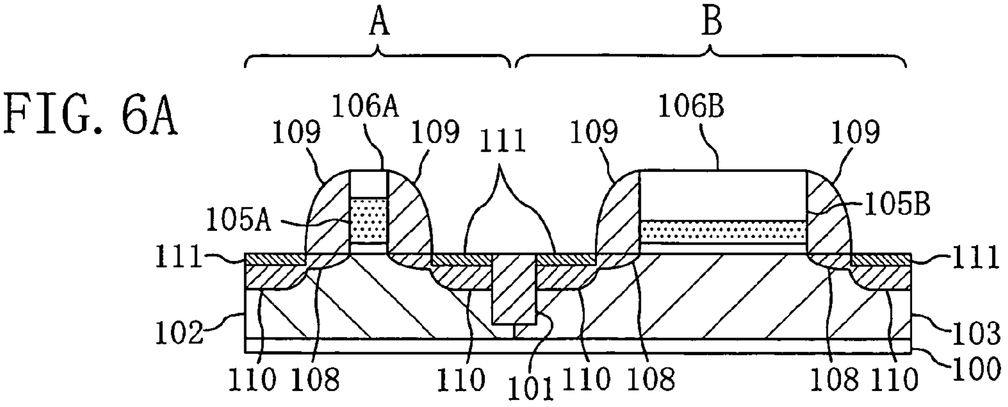
FIGS. 6A through 6E are cross-sectional views illustrating structures in respective process steps of the method for fabricating a semiconductor device according to the third embodiment in the order of fabrication.

Then, as illustrated in FIG. 6A, a natural oxide film formed on the surfaces of the deep n-type source/drain doped layers 110 is removed. Then, a nickel film is deposited by sputtering to a thickness of 20 nm over the entire surface of the semiconductor substrate 100. Thereafter, first RTA is performed on the semiconductor substrate 100 at 320° C. in a nitrogen atmosphere, thereby causing silicon forming the semiconductor substrate 100 and nickel in contact with this silicon portion to react with each other. This changes upper portions of the deep n-type source/drain doped layers 110 into nickel silicide. Subsequently, the semiconductor substrate 100 is immersed in an etchant in which hydrochloric acid and a hydrogen peroxide solution are mixed, thereby removing unreacted nickel films remaining on at least the isolation region 101, the protective films 106A and 106B and the sidewalls 109. Thereafter, second RTA is performed on the semiconductor substrate 100 at a temperature of 550° C. that is higher than the first RTA. In this manner, low-resistance nickel silicide layers 111 are formed in respective upper portions of the deep n-type source/drain doped layers 110.

Figure 6B:
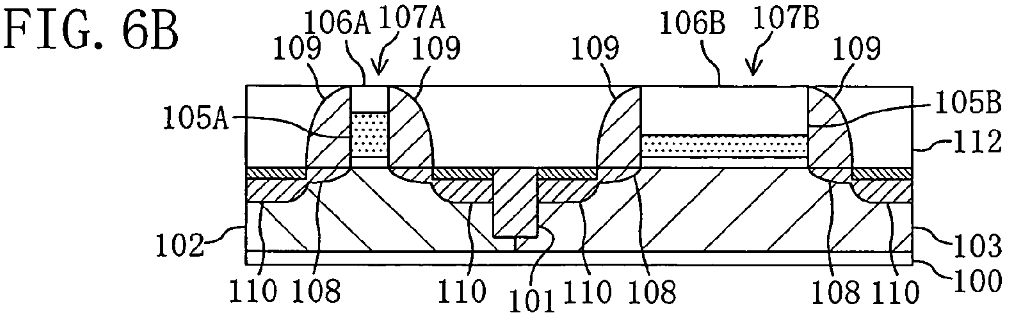

Then, as illustrated in FIG. 6B, an interlayer insulating film 112 of a silicon oxide film is formed over the entire surface of the semiconductor substrate 100 to cover the gate-electrode formation films 107A and 107B. Thereafter, the interlayer insulating film 112 is planalized by CMP until the sidewalls 109 and the protective films 106A and 106B are exposed.

Figure 6C:
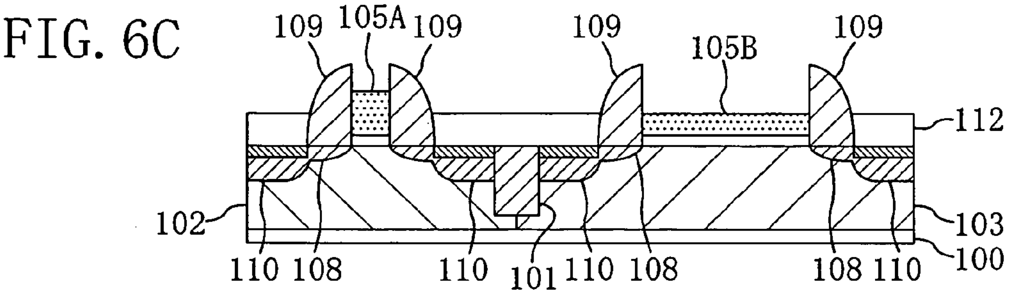

Then, as illustrated in FIG. 6C, the first protective film 106A and the second protective film 106B are etched under etching conditions having selectivities with respect to silicon nitride and polysilicon, thereby exposing the first polysilicon film 105A and the second polysilicon film 105B.

Figure 6D:
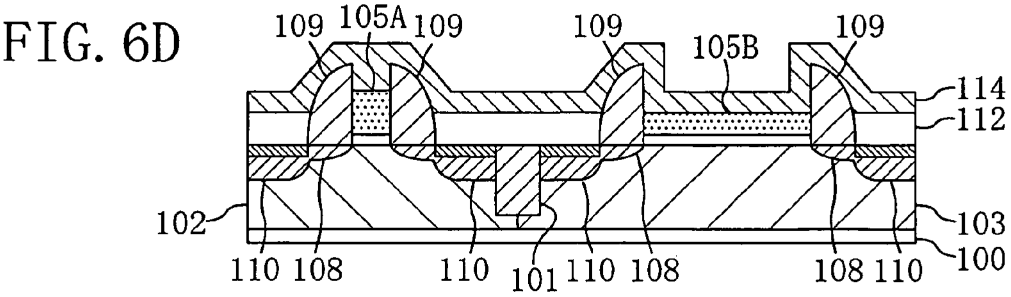
Figure 6E:
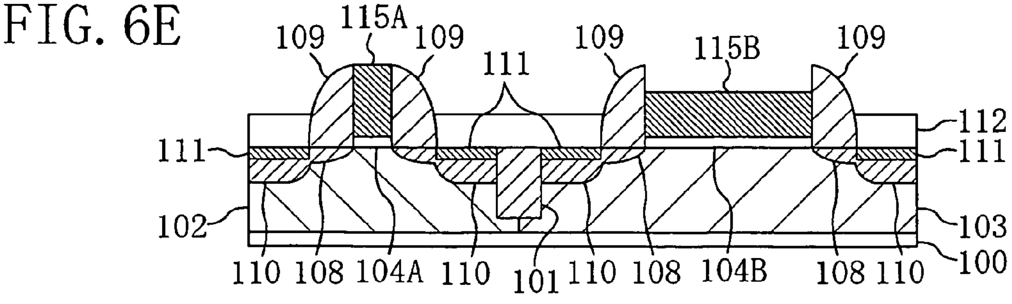

Thereafter, as illustrated in FIG. 6D, a metal film 114 of nickel is deposited by sputtering to a thickness of 50 nm over the entire surface including the interlayer insulating film 112, the sidewalls 109 and the polysilicon films 105A and 105B. Subsequently, third RTA is performed on the semiconductor substrate 100 at 400° C. in a nitrogen atmosphere to cause the polysilicon films 105A and 105B and the metal film 114 in contact with the polysilicon films 105A and 105B to react with each other, thereby fully siliciding the polysilicon films 105A and 105B. In this manner, as illustrated in FIG. 6E, a fully-silicided (FUSI) first gate electrode 115A and a FUSI second gate electrode 115B are formed in the first region A and the second region B, respectively.

As described above, in the third embodiment, the second polysilicon film 105B formed in the second region B is thinner than the first polysilicon film 105A formed in the first region A, so that the thickness ratio of the metal film 114 to the second polysilicon film 105B in the second region B is higher than those in conventional devices. Accordingly, no unreacted polysilicon region remains at least in a middle portion in the gate length direction of the second gate electrode 115B in the second region B, so that full silicidation is uniformly performed. As a result, variations in operation characteristics such as the threshold voltage caused by a remaining unreacted polysilicon region are suppressed, thus obtaining desired transistor characteristics.

Embodiment 4

Hereinafter, a method for fabricating a semiconductor device according to a fourth embodiment of the present invention will be described with reference to the drawings.

FIGS. 7A through 7E and FIGS. 8A through 8E illustrate cross-sectional structures in respective process steps of the method for fabricating a semiconductor device according to the fourth embodiment in the order of fabrication.

In the fourth embodiment, a polysilicon film is selectively formed only in a first region A and then another polysilicon is formed in the first region A and a second region B, so that the thickness of the polysilicon film in the second region B is smaller than that in the first region A.

Figure 7A:
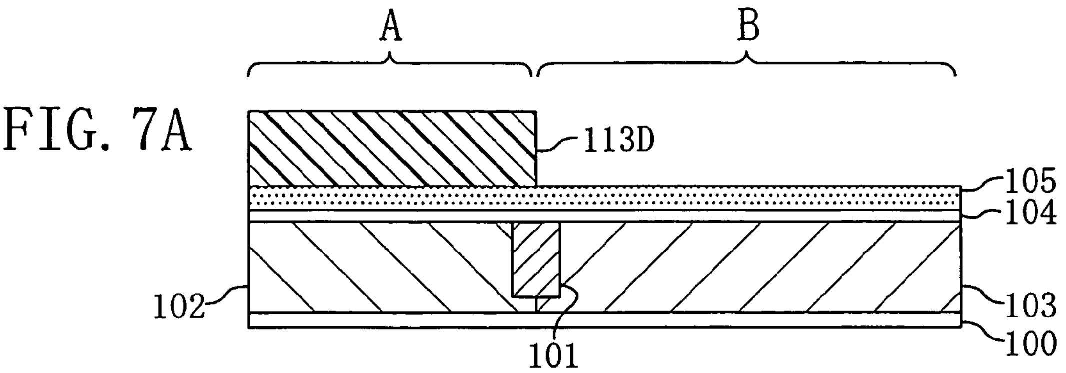
FIGS. 7A through 7E are cross-sectional views illustrating structures in respective process steps of a method for fabricating a semiconductor device according to a fourth embodiment of the present invention in the order of fabrication.

First, as illustrated in FIG. 7A, an isolation region 101 is formed in an upper portion of the semiconductor substrate 100. Then, a first p-well 102 is formed by ion implantation in the first region A of the semiconductor substrate 100. Subsequently, a second p-well 103 is formed by ion implantation in the second region B of the semiconductor substrate 100. Thereafter, a gate-insulating-film formation film 104 made of silicon oxide and having a thickness of 2 nm is formed by thermal oxidation on an active region of the semiconductor substrate 100. Then, a polysilicon film 105 for forming a first gate electrode is deposited by CVD to a thickness of 80 nm over the entire surface of the semiconductor substrate 100 including the isolation region 101 and the gate-insulating-film formation film 104. Subsequently, a resist pattern 113D is formed on the deposited polysilicon film 105 by lithography to cover the first region A.

Figure 7B:
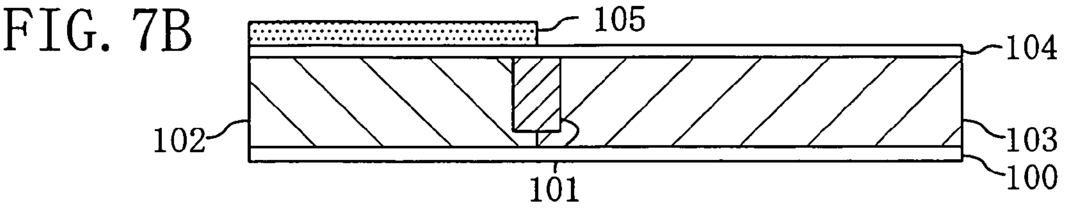

Next, as illustrated in FIG. 7B, dry etching or wet etching is performed using the resist pattern 113D as a mask, thereby removing a portion of the polysilicon film 105 in the second region B through etching. At this time, the portion of the polysilicon film 105 in the second region B may not be removed and may be etched to a thickness of about 10 nm.

Figure 7C:
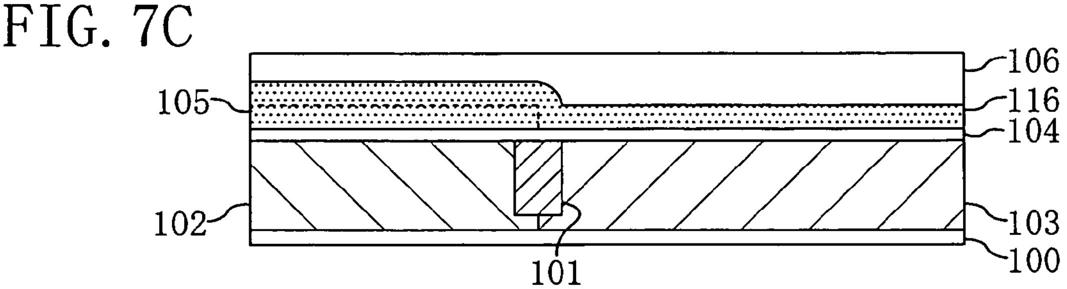

Then, as illustrated in FIG. 7C, the resist pattern 113D is removed, and then a polysilicon film 116 for forming first and second gate electrodes is deposited by CVD to a thickness of 80 nm over the entire surface of the semiconductor substrate 100 including the polysilicon film 105, the isolation region 101 and the gate-insulating-film formation film 104. Subsequently, a protective-film formation film 106 made of silicon oxide is deposited by CVD over the polysilicon film 116. Thereafter, the deposited protective-film formation film 106 is polished and planarized by CMP. At this time, a portion of the protective-film formation film 106 in the first region A has a thickness of 100 nm and a portion thereof in the second region B has a thickness of 180 nm.

Figure 7D:
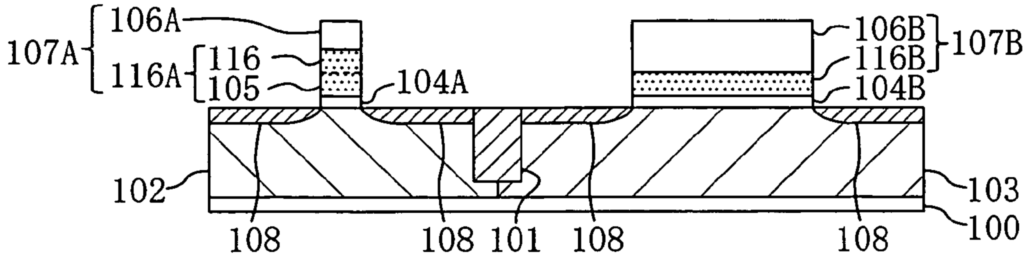

Thereafter, as illustrated in FIG. 7D, the protective-film formation film 106 is patterned into the shape of a gate electrode in each of the first and second regions A and B by lithography and dry etching, thereby forming a first protective film 106A and a second protective film 106B out of the protective-film formation film 106. At this time, the width (gate length) of the second protective film 106B in the second region B is larger than that of the first protective film 106A in the first region A. Subsequently, using the first and second protective films 106A and 106B obtained by patterning as masks, dry etching is performed on the polysilicon films 105 and 116 and the gate-insulating-film formation film 104. In this manner, a first gate-electrode formation film 107A including the first protective film 106A and a first polysilicon film 116A is formed in the first region A, whereas a second gate-electrode formation film 107B including the second protective film 106B and a second polysilicon film 116B is formed in the second region B. The first polysilicon film 116A is made of the stack of the polysilicon film 105 and the polysilicon film 116, and the second polysilicon film 116B is made of a single layer of the polysilicon film 116. At this time, a first gate insulating film 104A is formed out of the gate-insulating-film formation film 104 in the first region A, whereas a second gate insulating film 104B is formed out of the gate-insulating-film formation film 104 in the second region B. Subsequently, ion implantation using phosphorus (P) or arsenic (As) as an n-type dopant is performed such that shallow n-type source/drain doped layers 108 are formed in the first p-well 102 and the second p-well 103 with the first gate-electrode formation film 107A and the second gate-electrode formation film 107B used as masks.

Figure 7E:
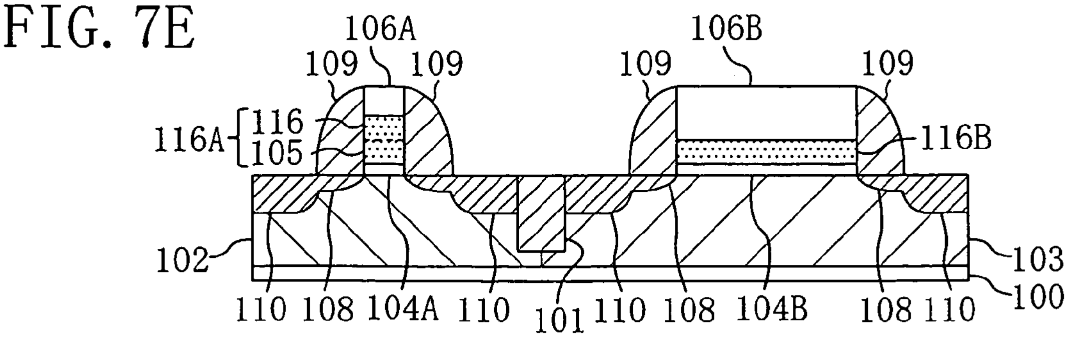

Subsequently, as illustrated in FIG. 7E, a silicon nitride film is deposited by CVD to a thickness of 50 nm over the entire surface of the semiconductor substrate 100 including the gate-electrode formation films 107A and 107B. Then, anisotropic etching is performed on the deposited silicon nitride film, thereby forming sidewalls 109 of a silicon nitride film on both sides of each of the gate-electrode formation films 107A and 107B. Thereafter, ion implantation using phosphorus (P) or arsenic (As) is performed using, as masks, the gate-electrode formation films 107A and 107B provided with the sidewalls 109. Then, with heat treatment for activating the implanted impurity, deep n-type source/drain doped layers 110 are formed in the first p-well 102 and the second p-well 103 below the sides of the sidewalls 109 on the gate-electrode formation films 107A and 107B.

Figure 8A:
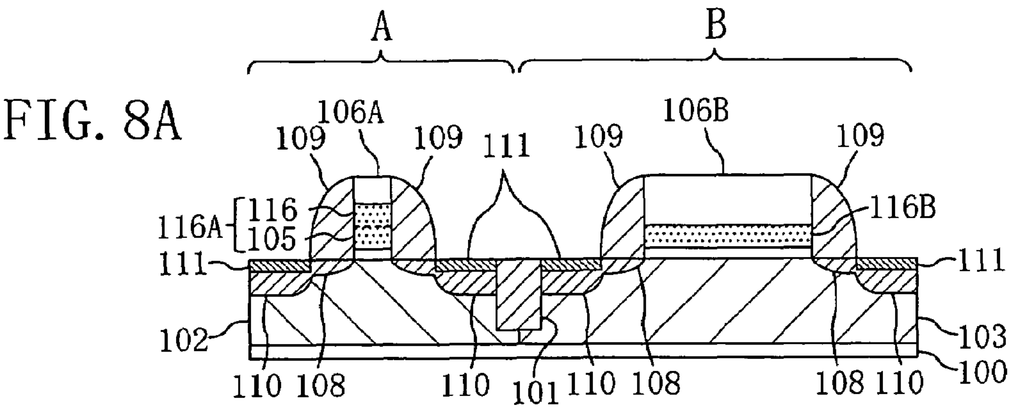
FIGS. 8A through 8E are cross-sectional views illustrating structures in respective process steps of the method for fabricating a semiconductor device according to the fourth embodiment in the order of fabrication.

Then, as illustrated in FIG. 8A, a natural oxide film formed on the surfaces of the deep n-type source/drain doped layers 110 is removed. Then, a nickel film is deposited by sputtering to a thickness of 20 nm over the entire surface of the semiconductor substrate 100. Thereafter, first RTA is performed on the semiconductor substrate 100 at 320° C. in a nitrogen atmosphere, thereby causing silicon forming the semiconductor substrate 100 and nickel in contact with this silicon portion to react with each other. This changes upper portions of the deep n-type source/drain doped layers 110 into nickel silicide. Subsequently, the semiconductor substrate 100 is immersed in an etchant in which hydrochloric acid and a hydrogen peroxide solution are mixed, thereby removing unreacted nickel films remaining on at least the isolation region 101, the protective films 106A and 106B and the sidewalls 109. Thereafter, second RTA is performed on the semiconductor substrate 100 at a temperature of 550° C. that is higher than the first RTA. In this manner, low-resistance nickel silicide layers 111 are formed in respective upper portions of the deep n-type source/drain doped layers 110.

Figure 8B:
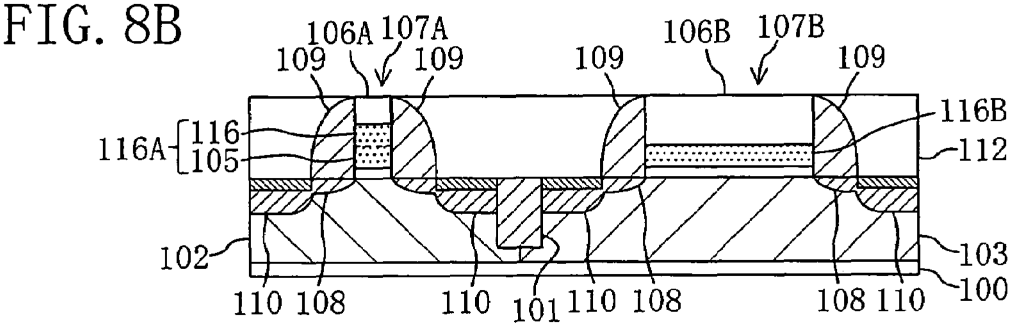

Then, as illustrated in FIG. 8B, an interlayer insulating film 112 of a silicon oxide film is formed over the entire surface of the semiconductor substrate 100 to cover the gate-electrode formation films 107A and 107B. Thereafter, the interlayer insulating film 112 is planalized by CMP until the sidewalls 109 and the protective films 106A and 106B are exposed.

Figure 8C:
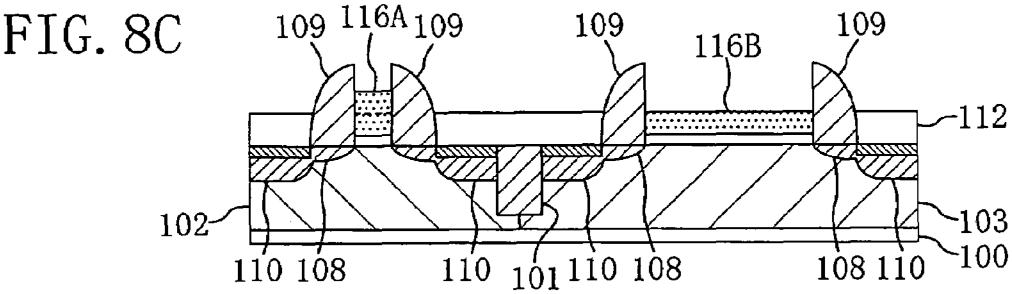

Then, as illustrated in FIG. 8C, the first protective film 106A and the second protective film 106B are etched under etching conditions having selectivities with respect to silicon nitride and polysilicon, thereby exposing the first polysilicon film 116A and the second polysilicon film 116B.

Figure 8D:
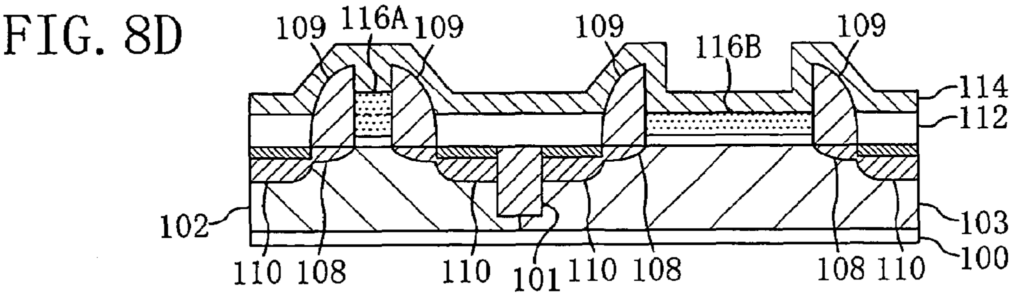
Figure 8E:
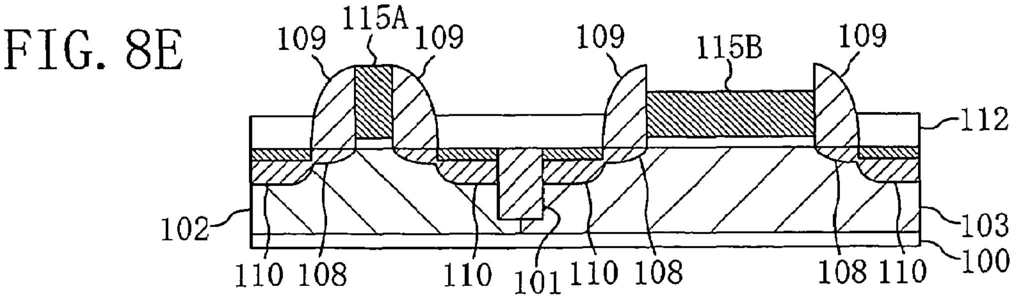

Thereafter, as illustrated in FIG. 8D, a metal film 114 of nickel having a thickness of 50 nm is deposited by sputtering over the entire surface including the interlayer insulating film 112, the sidewalls 109 and the polysilicon films 116A and 116B. Subsequently, third RTA is performed on the semiconductor substrate 100 at 400° C. in a nitrogen atmosphere to cause the polysilicon films 116A and 116B and the metal film 114 in contact with the polysilicon films 116A and 116B to react with each other, thereby fully siliciding the polysilicon films 116A and 116B. In this manner, as illustrated in FIG. 8E, a fully silicided (FUSI) first gate electrode 115A and a FUSI second gate electrode 115B are formed in the first region A and the second region B, respectively.

As described above, in the fourth embodiment, the second polysilicon film 116B formed in the second region B is thinner than the first polysilicon film 116A formed in the first region A, so that the thickness ratio of the metal film 114 to the second polysilicon film 116B in the second region B is higher than those in conventional devices. Accordingly, no unreacted polysilicon region remains at least in a middle portion in the gate length direction of the second gate electrode 115B in the second region B, so that full silicidation is uniformly performed. As a result, variations in operation characteristics such as the threshold voltage caused by a remaining unreacted polysilicon region are suppressed, thus obtaining desired transistor characteristics.

In the fourth embodiment, in the process step shown in FIG. 7C, a portion of the polysilicon film 116 deposited on the second region B is determined not by etching but by deposition. Accordingly, controllability of the thickness of the polysilicon film is excellent, as compared to the third embodiment in which the thickness is determined by etching shown in FIG. 5B.

Embodiment 5

Hereinafter, a method for fabricating a semiconductor device according to a fifth embodiment of the present invention will be described with reference to the drawings.

FIGS. 9A through 9E and FIGS. 10A through 10E illustrate cross-sectional structures in respective process steps of the method for fabricating a semiconductor device according to the fifth embodiment in the order of fabrication.

In the fifth embodiment, a polysilicon film is patterned, and then the thickness of a first polysilicon film in a first region A is made larger than that of a second polysilicon film in a second region B.

Figures 9A, 9B, 9C, 9D, 9E:
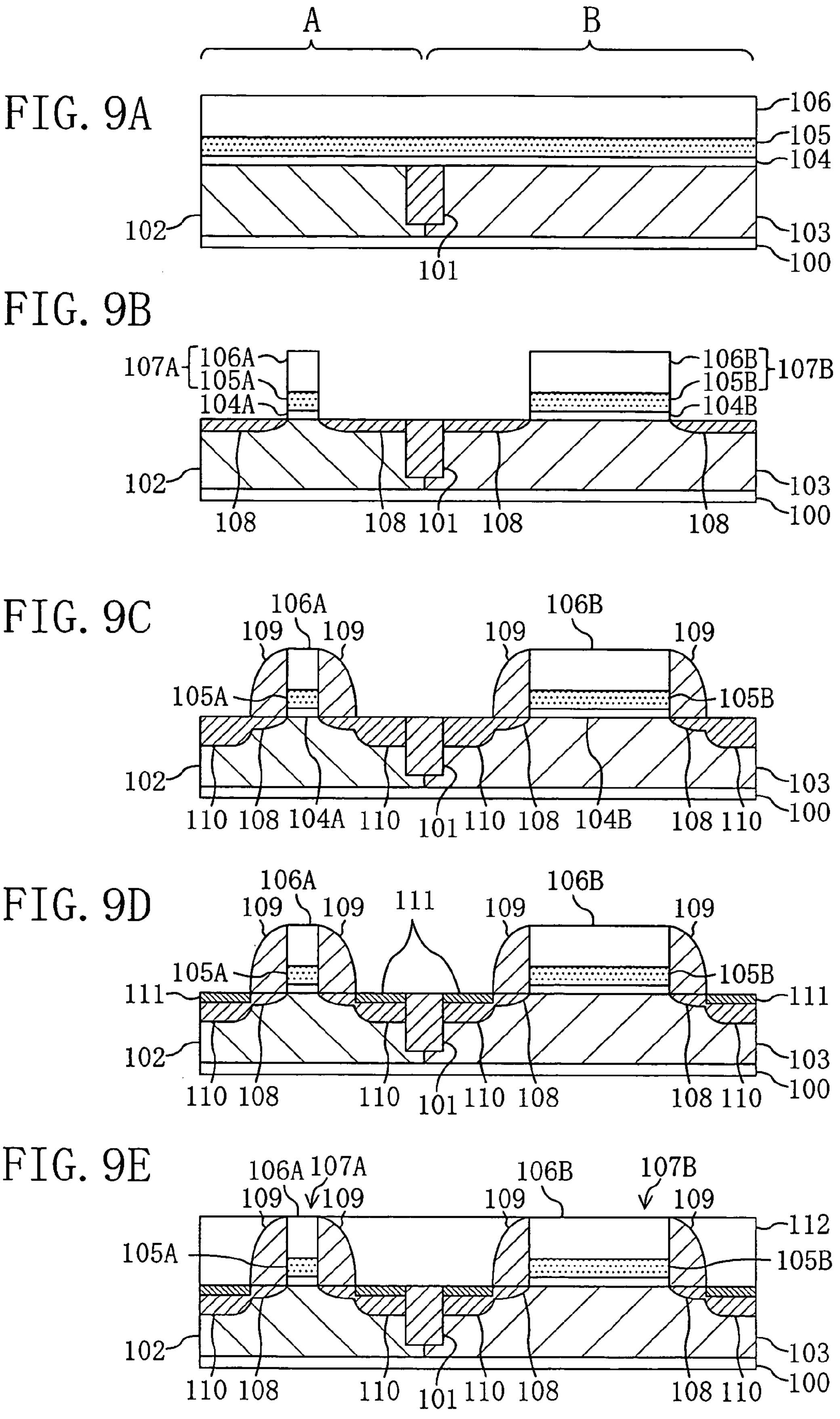
FIGS. 9A through 9E are cross-sectional views illustrating structures in respective process steps of a method for fabricating a semiconductor device according to a fifth embodiment of the present invention in the order of fabrication.

First, as illustrated in FIG. 9A, an isolation region 101 is formed in an upper portion of the semiconductor substrate 100. Then, a first p-well 102 is formed by ion implantation in the first region A of the semiconductor substrate 100. Subsequently, a second p-well 103 is formed by ion implantation in the second region B of the semiconductor substrate 100. Thereafter, a gate-insulating-film formation film 104 made of silicon oxide and having a thickness of 2 nm is formed by thermal oxidation on an active region of the semiconductor substrate 100. Then, a polysilicon film 105 with a thickness of 80 nm for forming a gate electrode and a protective-film formation film 106 with a thickness of 180 nm are deposited in this order by CVD over the entire surface of the semiconductor substrate 100 including the isolation region 101 and the gate-insulating-film formation film 104.

Next, as illustrated in FIG. 9B, the protective-film formation film 106 is patterned into the shape of gate electrodes in the respective first and second regions A and B by lithography and dry etching, thereby forming a first protective film 106A and a second protective film 106B out of the protective-film formation film 106. At this time, the width (gate length) of the second protective film 106B in the second region B is larger than that of the first protective film 106A in the first region A. Subsequently, using the first and second protective films 106A and 106B obtained by patterning as masks, dry etching is performed on the polysilicon film 105 and the gate-insulating-film formation film 104. In this manner, a first gate-electrode formation film 107A including the first protective film 106A and a first polysilicon film 105A is formed in the first region A, whereas a second gate-electrode formation film 107B including the second protective film 106B and a second polysilicon film 105B is formed in the second region B. At this time, a first gate insulating film 104A is formed out of the gate-insulating-film formation film 104 in the first region A, whereas a second gate insulating film 104B is formed out of the gate-insulating-film formation film 104 in the second region B. Subsequently, ion implantation using phosphorus (P) or arsenic (As) as an n-type dopant is performed such that shallow n-type source/drain doped layers 108 are formed in the first p-well 102 and the second p-well 103, respectively, with the first gate-electrode formation film 107A and the second gate-electrode formation film 107B used as masks.

Subsequently, as illustrated in FIG. 9C, a silicon nitride film is deposited by CVD to a thickness of 50 nm over the entire surface of the semiconductor substrate 100 including the gate-electrode formation films 107A and 107B. Then, anisotropic etching is performed on the deposited silicon nitride film, thereby forming sidewalls 109 of a silicon nitride film on both sides of each of the gate-electrode formation films 107A and 107B. Thereafter, ion implantation using phosphorus (P) or arsenic (As) is performed using, as masks, the gate-electrode formation films 107A and 107B provided with the sidewalls 109. Then, with heat treatment for activating the implanted impurity, deep n-type source/drain doped layers 110 are formed in the first p-well 102 and the second p-well 103 below the sides of the sidewalls 109 on the gate-electrode formation films 107A and 107B.

Then, as illustrated in FIG. 9D, a natural oxide film formed on the surfaces of the deep n-type source/drain doped layers 110 is removed. Then, a nickel film is deposited by sputtering to a thickness of 20 nm over the entire surface of the semiconductor substrate 100. Thereafter, first RTA is performed on the semiconductor substrate 100 at 320° C. in a nitrogen atmosphere, thereby causing silicon forming the semiconductor substrate 100 and nickel in contact with this silicon portion to react with each other. This changes upper portions of the deep n-type source/drain doped layers 110 into nickel silicide. Subsequently, the semiconductor substrate 100 is immersed in an etchant in which hydrochloric acid and a hydrogen peroxide solution are mixed, thereby removing unreacted nickel films remaining on at least the isolation region 101, the protective films 106A and 106B and the sidewalls 109. Thereafter, second RTA is performed on the semiconductor substrate 100 at a temperature of 550° C. that is higher than the first RTA. In this manner, low-resistance nickel silicide layers 111 are formed in respective upper portions of the deep n-type source/drain doped layers 110.

Thereafter, as illustrated in FIG. 9E, an interlayer insulating film 112 of a silicon oxide film is formed over the entire surface of the semiconductor substrate 100 to cover the gate-electrode formation films 107A and 107B. Thereafter, the interlayer insulating film 112 is planalized by CMP until the sidewalls 109 and the protective films 106A and 106B are exposed.

Figure 10A:
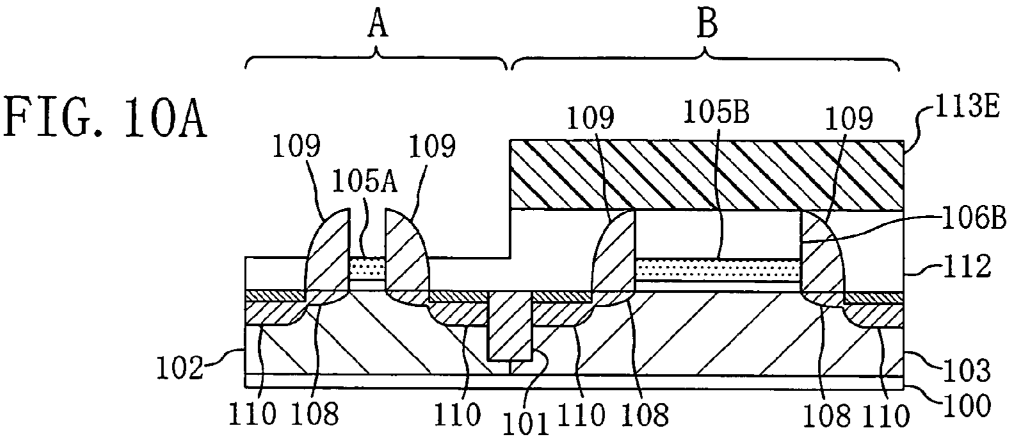
FIGS. 10A through 10E are cross-sectional views illustrating structures in respective process steps of the method for fabricating a semiconductor device according to the fifth embodiment.

Subsequently, as illustrated in FIG. 10A, a first resist pattern 113E is formed on the interlayer insulating film 112, the second protective film 106B and the sidewalls 109 to cover the second region B. Subsequently, the first protective film 106A in the first region A is etched under etching conditions having selectivities with respect to silicon nitride and polysilicon using the first resist pattern 113E as a mask so that the first protective film 106A is removed, thereby exposing the first polysilicon film 105A.

Figure 10B:
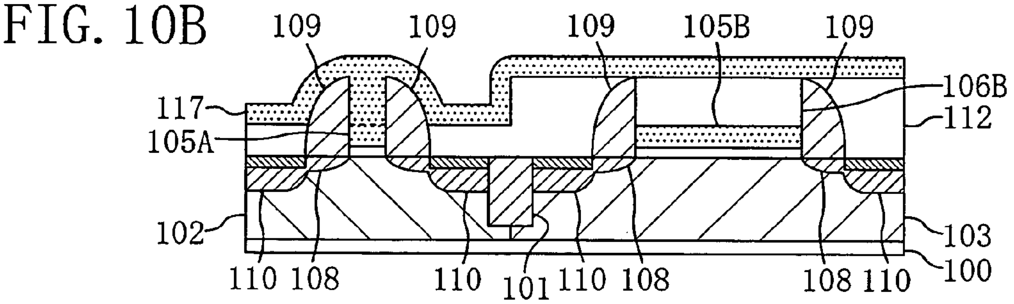
Figure 10C:
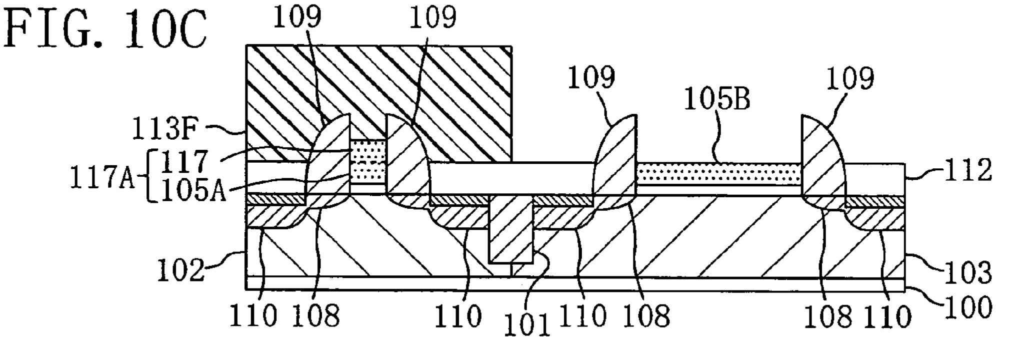

Then, as illustrated in FIG. 10B, the first resist pattern 113E is removed, and then a polysilicon film 117 is deposited by CVD to a thickness of 80 nm over the entire surfaces of the interlayer insulating film 112, the sidewalls 109 and the second protective film 106B including the exposed first polysilicon film 105A. At this time, the distance between the inner walls of the sidewalls 109 in the first region A is smaller than the value twice as large as the thickness of the polysilicon film 117, so that the polysilicon film 117 is buried between the sidewalls 109 on the first polysilicon film 105A. Accordingly, the thickness of the polysilicon film 117 on the first polysilicon film 105A is larger than that of the polysilicon film 117 in the other region. Thereafter, the deposited polysilicon film 117 is etched back, thereby forming a first polysilicon film 117A between the sidewalls 109 on the first polysilicon film 105A, as illustrated in FIG. 10C. This first polysilicon film 117A is made of the stack of the first polysilicon film 105A and the polysilicon film 117. In this manner, the thickness of the first polysilicon film 117A in the first region A is larger than that of the second polysilicon film 105B in the second region B.

Thereafter, as illustrated in FIG. 10C, a second resist pattern 113F is formed on the interlayer insulating film 112, the first polysilicon film 117A and the sidewalls 109 to cover the first region A. Subsequently, using the second resist pattern 113F as a mask, a portion of the second protective film 106B in the second region B is etched under etching conditions having selectivities with respect to silicon nitride and polysilicon so that the second protective film 106B is removed, thereby exposing the second polysilicon film 105B.

Figure 10D:
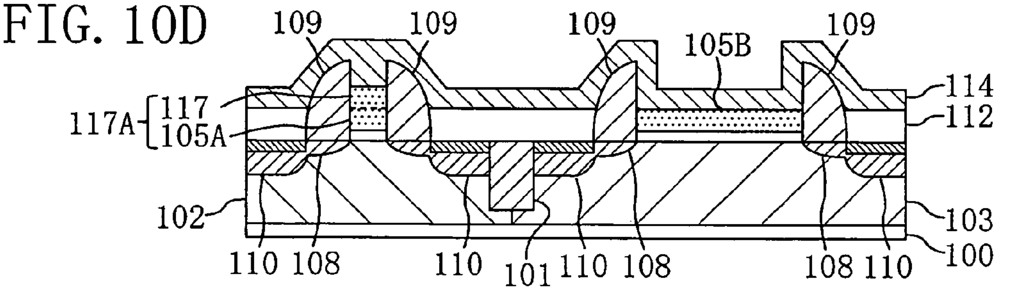
Figure 10E:
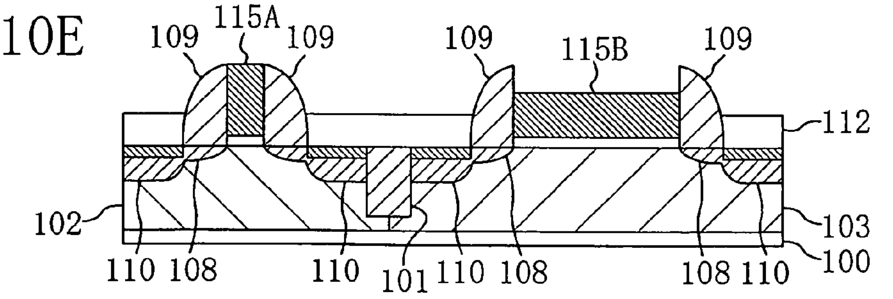

Thereafter, as illustrated in FIG. 10D, a metal film 114 of nickel is deposited by sputtering to a thickness of 50 nm over the entire surface including the interlayer insulating film 112, the sidewalls 109 and the polysilicon films 117A and 105B. Subsequently, third RTA is performed on the semiconductor substrate 100 at 400° C. in a nitrogen atmosphere to cause the polysilicon films 117A and 105B and the metal film 114 in contact with the polysilicon films 117A and 105B to react with each other, thereby fully siliciding the polysilicon films 117A and 105B. In this manner, as illustrated in FIG. 10E, a fully silicided (FUSI) first gate electrode 115A and a FUSI second gate electrode 115B are formed on the first region A and the second region B, respectively.

As described above, in the fifth embodiment, the second polysilicon film 105B formed in the second region B is thinner than the first polysilicon film 117A formed in the first region A, so that the thickness ratio of the metal film 114 to the second polysilicon film 105B in the second region B is higher than those in conventional devices. Accordingly, no unreacted polysilicon region remains at least in a middle portion in the gate length direction of the second gate electrode 115B in the second region B, so that full silicidation is uniformly performed. As a result, variations in operation characteristics such as the threshold voltage caused by a remaining unreacted polysilicon region are suppressed, thus obtaining desired transistor characteristics.

Embodiment 6

Hereinafter, a method for fabricating a semiconductor device according to a sixth embodiment of the present invention will be described with reference to the drawings.

FIGS. 11A through 11D and FIGS. 12A through 12E illustrate cross-sectional structures in respective process steps of the method for fabricating a semiconductor device according to the sixth embodiment in the order of fabrication.

In the sixth embodiment, a polysilicon film is patterned, another polysilicon film is formed on a first polysilicon film in a first region A and a second polysilicon film in a second region B, and then etch-back is performed. In this manner, the thickness of the second polysilicon film in the second region B is made smaller than that of the first polysilicon film in the first region A and a cross-section in the gate length direction has a recess.

Figure 11A:
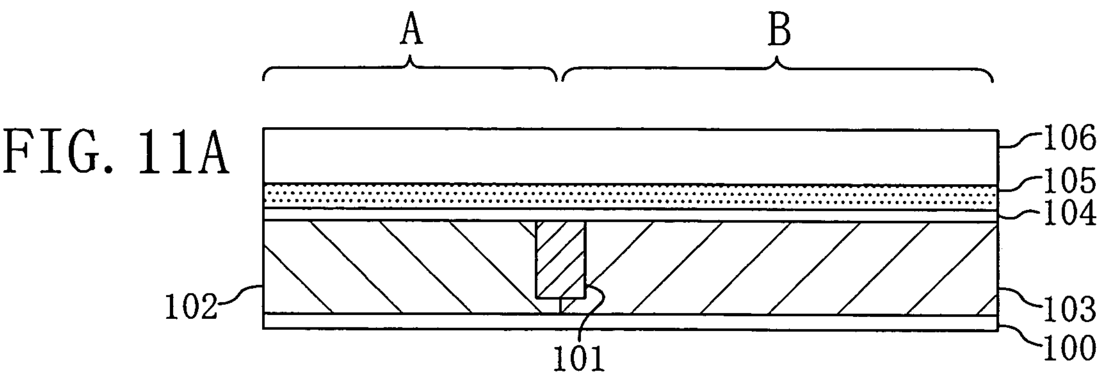
FIGS. 11A through 11D are cross-sectional views illustrating structures in respective process steps of a method for fabricating a semiconductor device according to a sixth embodiment of the present invention in the order of fabrication.

First, as illustrated in FIG. 11A, an isolation region 101 is formed in an upper portion of the semiconductor substrate 100. Then, a first p-well 102 is formed by ion implantation in the first region A of the semiconductor substrate 100. Subsequently, a second p-well 103 is formed by ion implantation in the second region B of the semiconductor substrate 100. Thereafter, a gate-insulating-film formation film 104 made of silicon oxide and having a thickness of 2 nm is formed by thermal oxidation on an active region of the semiconductor substrate 100. Then, a polysilicon film 105 with a thickness of 80 nm for forming a gate electrode and a protective-film formation film 106 with a thickness of 180 nm are deposited in this order by CVD over the entire surface of the semiconductor substrate 100 including the isolation region 101 and the gate-insulating-film formation film 104.

Figure 11B:
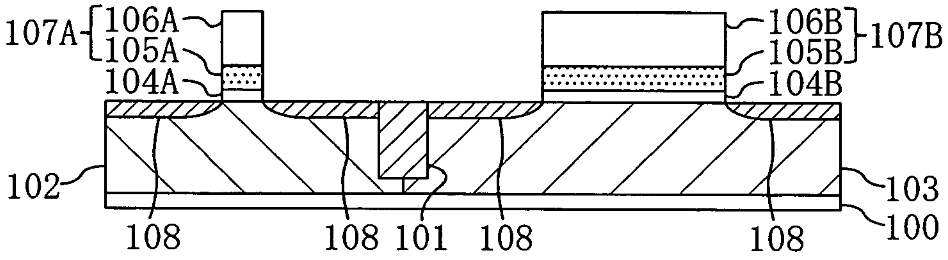

Next, as illustrated in FIG. 11B, the protective-film formation film 106 is patterned into the shape of a gate electrode in each of the first and second regions A and B by lithography and dry etching, thereby forming a first protective film 106A and a second protective film 106B out of the protective-film formation film 106. At this time, the width (gate length) of the second protective film 106B in the second region B is larger than that of the first protective film 106A in the first region A. Subsequently, using the first and second protective films 106A and 106B obtained by patterning as masks, dry etching is performed on the polysilicon film 105 and the gate-insulating-film formation film 104. In this manner, a first gate-electrode formation film 107A including the patterned first protective film 106A and a first polysilicon film 105A is formed in the first region A, whereas a second gate-electrode formation film 107B including the patterned second protective film 106B and a second polysilicon film 105B is formed in the second region B. At this time, a first gate insulating film 104A is formed out of the gate-insulating-film formation film 104 in the first region A, whereas a second gate insulating film 104B is formed out of the gate-insulating-film formation film 104 in the second region B. Subsequently, ion implantation using phosphorus (P) or arsenic (As) as an n-type dopant is performed such that shallow n-type source/drain doped layers 108 are formed in the first p-well 102 and the second p-well 103 with the first gate-electrode formation film 107A and the second gate-electrode formation film 107B used as masks.

Figure 11C:
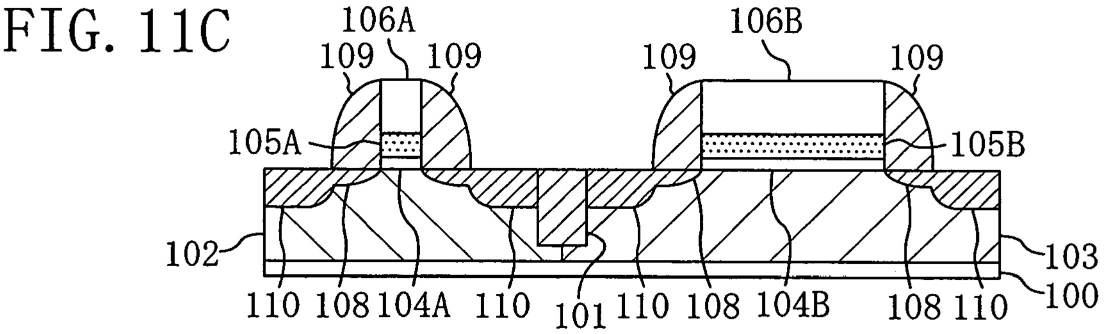

Subsequently, as illustrated in FIG. 11C, a silicon nitride film is deposited by CVD to a thickness of 50 nm over the entire surface of the semiconductor substrate 100 including the gate-electrode formation films 107A and 107B. Then, anisotropic etching is performed on the deposited silicon nitride film, thereby forming sidewalls 109 of a silicon nitride film on both sides of each of the gate-electrode formation films 107A and 107B. Thereafter, ion implantation using phosphorus (P) or arsenic (As) is performed using, as masks, the gate-electrode formation films 107A and 107B provided with the sidewalls 109. Then, with heat treatment for activating the implanted impurity, deep n-type source/drain doped layers 110 are formed below the sides of the sidewalls 109 on the gate-electrode formation films 107A and 107B in the first p-well 102 and the second p-well 103.

Figure 11D:
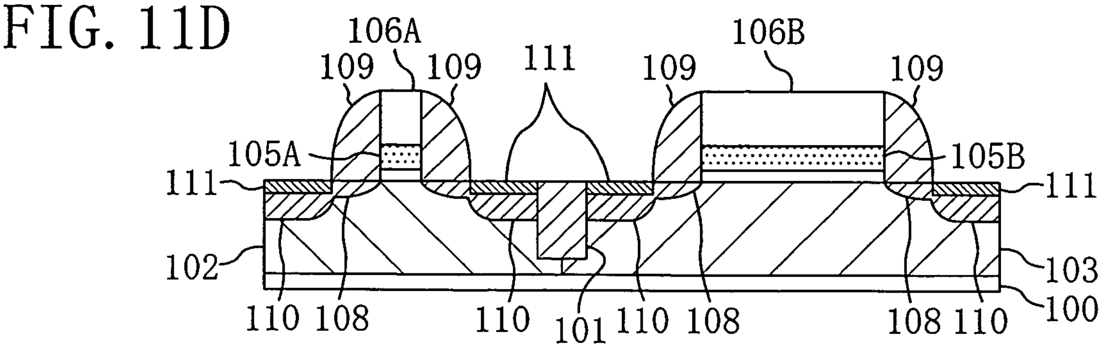

Then, as illustrated in FIG. 11D, a natural oxide film formed on the surfaces of the deep n-type source/drain doped layers 110 is removed. Then, a nickel film is deposited by sputtering to a thickness of 20 nm over the entire surface of the semiconductor substrate 100. Thereafter, first RTA is performed on the semiconductor substrate 100 at 320° C. in a nitrogen atmosphere, thereby causing silicon forming the semiconductor substrate 100 and nickel in contact with this silicon portion to react with each other. This changes upper portions of the deep n-type source/drain doped layers 110 into nickel silicide. Subsequently, the semiconductor substrate 100 is immersed in an etchant in which hydrochloric acid and a hydrogen peroxide solution are mixed, thereby removing unreacted nickel films remaining on at least the isolation region 101, the protective films 106A and 106B and the sidewalls 109. Thereafter, second RTA is performed on the semiconductor substrate 100 at a temperature of 550° C. that is higher than the first RTA. In this manner, low-resistance nickel silicide layers 111 are formed in respective upper portions of the deep n-type source/drain doped layers 110.

Figures 12A, 12B, 12C, 12D, 12E:
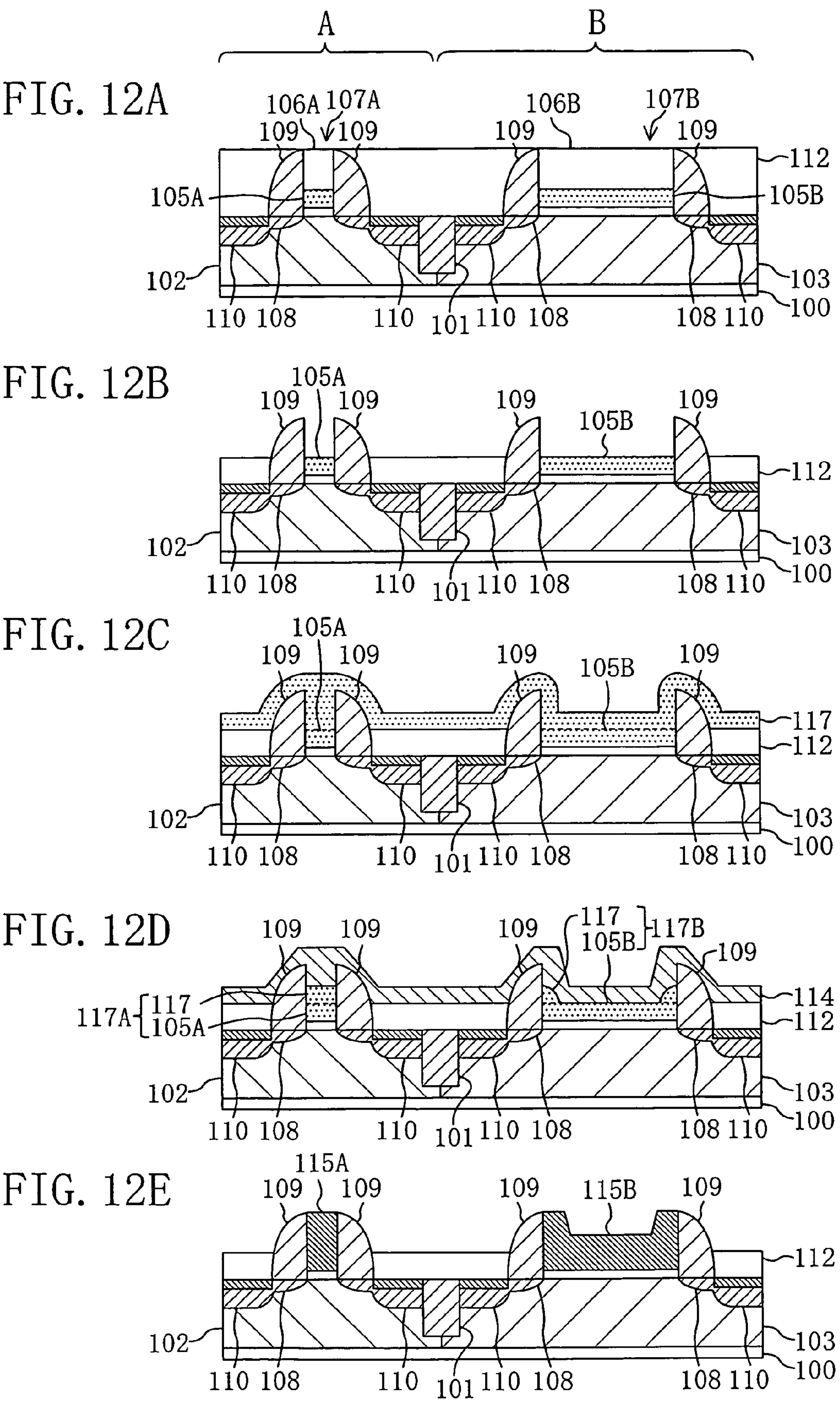
FIGS. 12A through 12E are cross-sectional views illustrating structures in respective process steps of the method for fabricating a semiconductor device according to the sixth embodiment in the order of fabrication.

Thereafter, as illustrated in FIG. 12A, an interlayer insulating film 112 of a silicon oxide film is formed over the entire surface of the semiconductor substrate 100 to cover the gate-electrode formation films 107A and 107B. Thereafter, the interlayer insulating film 112 is planalized by CMP until the sidewalls 109 and the protective films 106A and 106B are exposed.

Subsequently, as illustrated in FIG. 12B, the first protective film 106A and the second protective film 106B are etched under etching conditions having selectivities with respect to silicon nitride and polysilicon so that the protective films 106A and 106B are removed, thereby exposing the first polysilicon film 105A and the second polysilicon film 105B.

Then, as illustrated in FIG. 12C, a polysilicon film 117 is deposited by CVD to a thickness of 80 nm over the entire surface including the interlayer insulating film 112, the sidewalls 109 and the exposed first and second polysilicon films 105A and 105B. Subsequently, the deposited polysilicon film 117 is etched back. At this time, the distance between the inner walls of the sidewalls 109 in the first region A is smaller than the value twice as large as the thickness of the polysilicon film 117, so that the polysilicon film 117 is buried between the sidewalls 109 on the first polysilicon film 105A. Accordingly, the thickness of a portion of the polysilicon film 117 on the first polysilicon film 105A is larger than that of portions of the polysilicon film 117 on the interlayer insulating film 112 and the sidewalls 109. The thickness of a portion of the polysilicon film 117 on the second polysilicon film 105B is increased at both ends thereof because of portions of the polysilicon film 117 formed on the sides of the sidewalls 109. The thickness of a middle portion of the polysilicon film 117 on the second polysilicon film 105B is equal to that of portions of the polysilicon film 117 formed on the interlayer insulating film 112 and the sidewalls 109. Thereafter, the deposited polysilicon film 117 is etched back, thereby removing unnecessary portions of the polysilicon film 117 on the interlayer insulating film 112 and the sidewalls 109. In this manner, a first polysilicon film 117A is formed on the first gate insulating film 104A in the first region A. A second polysilicon film 117B is formed on the second gate insulating film 104B in the second region B. The first polysilicon film 117A is made of the stack of the first polysilicon film 105A and the polysilicon film 117. On the other hand, end portions of the second polysilicon film 117B in the gate length direction are made of the stack of the second polysilicon film 105B and the polysilicon film 117 and a middle portion thereof is made only of the second polysilicon film 105B. Accordingly, the thickness of the first polysilicon film 117A in the first region A is larger than that of the middle portion of the second polysilicon film 117B in the second region B. In addition, since the polysilicon film 117 remains in the ends of the second polysilicon film 117B in the gate length direction, a cross section of the second polysilicon film 117B in the gate length direction is has a recess. The advantages of this embodiment are remarkable in a case where the thickness of the polysilicon film 117 is larger than a half of the width (gate length) of the first polysilicon film 105A and is smaller than a half of the width (gate length) of the second polysilicon film 105B.

Thereafter, as illustrated in FIG. 12D, a metal film 114 of nickel is deposited by sputtering to a thickness of 50 nm over the entire surface including the interlayer insulating film 112, the sidewalls 109 and the polysilicon films 117A and 117B. Subsequently, third RTA is performed on the semiconductor substrate 100 at 400° C. in a nitrogen atmosphere to cause the polysilicon films 117A and 117B and the metal film 114 in contact with the polysilicon films 117A and 117B to react with each other, thereby fully siliciding the polysilicon films 117A and 117B. In this manner, as illustrated in FIG. 12E, a fully-silicided (FUSI) first gate electrode 115A and a FUSI second gate electrode 115B are formed on the first region A and the second region B, respectively.

As described above, in the sixth embodiment, a middle portion in the gate length direction of the second polysilicon film 117B formed in the second region B is thinner than the first polysilicon film 117A formed in the first region A, so that the thickness ratio of the metal film 114 to the middle portion of the second polysilicon film 117B in the second region B is higher than those in conventional devices. Accordingly, no unreacted polysilicon region remains at least in the middle portion in the gate length direction of the second gate electrode 115B in the second region B, so that full silicidation is uniformly performed. As a result, variations in operation characteristics such as the threshold voltage caused by a remaining unreacted polysilicon region are suppressed.

In addition, in the sixth embodiment, a portion of the polysilicon film 117 remaining after etch-back is formed in the ends of the second polysilicon film 117B in contact with the sidewalls 109. Accordingly, even if the thickness of the metal film 114 increases on the inner walls of the sidewalls 109, the thickness of the ends of the second polysilicon film 117B in contact with the sidewalls 109 remains in a substantially sufficient thickness range. Accordingly, an excessive supply of nickel atoms forming the metal film 114 near the sidewalls 109 is avoided during full silicidation of the second gate electrode 115B. This prevents a so-called metal-rich FUSI electrode from being formed in both ends of the second gate electrode 115B. As a result, variation of the gate resistance due to a nonuniform silicide composition in the second gate electrode 115B is suppressed, thus obtaining desired transistor characteristics.

Embodiment 7

Hereinafter, a method for fabricating a semiconductor device according to a seventh embodiment of the present invention will be described with reference to the drawings.

FIGS. 13A through 13E and FIGS. 14A through 14E illustrate cross-sectional structures in respective process steps of the method for fabricating a semiconductor device according to the seventh embodiment in the order of fabrication.

In the seventh embodiment, a polysilicon film is patterned, and then another polysilicon film is deposited on a first polysilicon film in a first region A and a second polysilicon film in a second region B. At this time, both ends of the second protective film in the gate direction (i.e., toward sidewalls) covering the second polysilicon film are selectively removed. In this manner, the second polysilicon film in the second region B is made thinner than the first polysilicon film in the first region A and a cross section in the gate length direction has a recess.

Figures 13A, 13B, 13C, 13D, 13E:
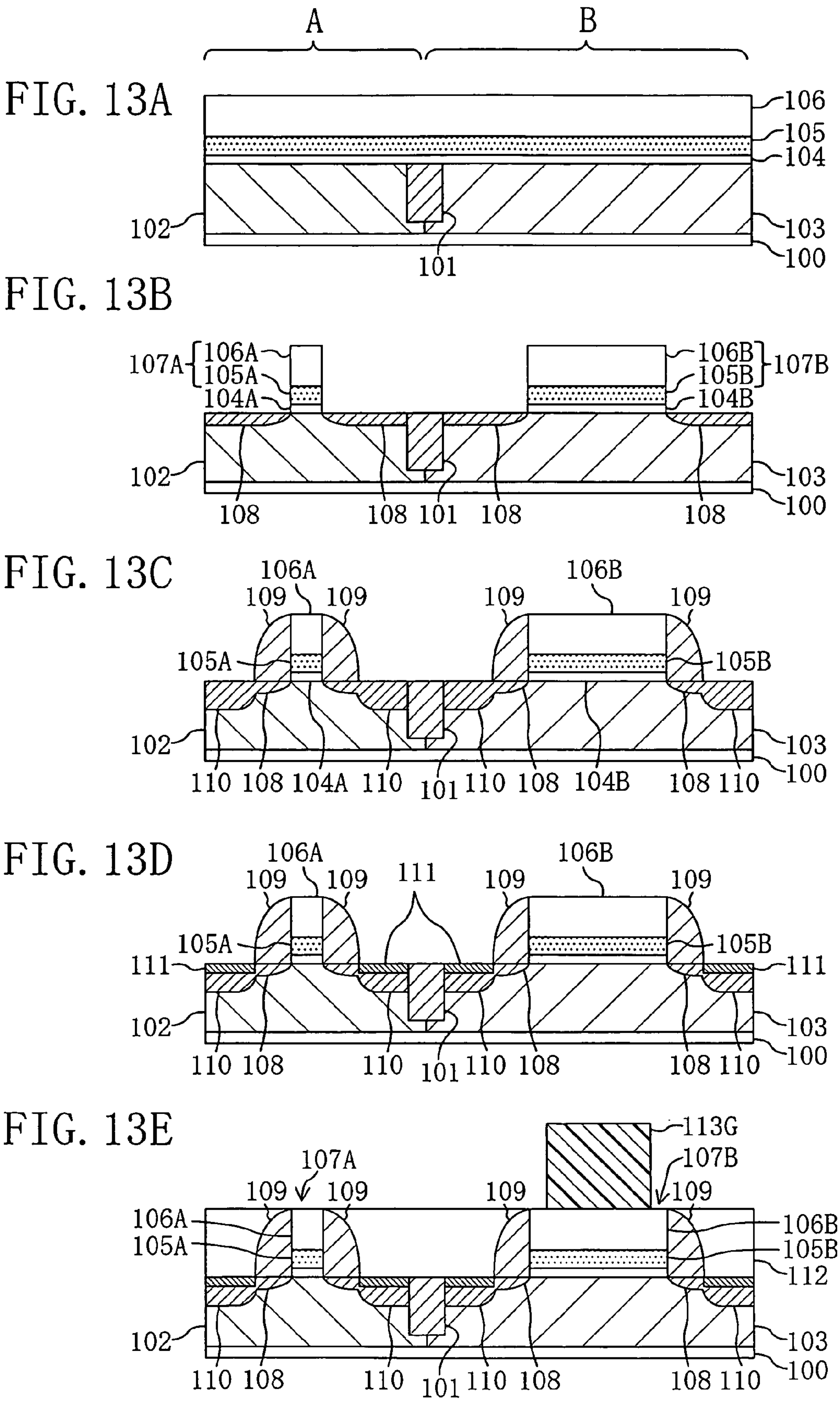
FIGS. 13A through 13E are cross-sectional views illustrating structures in respective process steps of a method for fabricating a semiconductor device according to a seventh embodiment of the present invention in the order of fabrication.

First, as illustrated in FIG. 13A, an isolation region 101 is formed in an upper portion of the semiconductor substrate 100. Then, a first p-well 102 is formed by ion implantation in the first region A of the semiconductor substrate 100. Subsequently, a second p-well 103 is formed by ion implantation in the second region B of the semiconductor substrate 100. Thereafter, a gate-insulating-film formation film 104 made of silicon oxide and having a thickness of 2 nm is formed by thermal oxidation on an active region of the semiconductor substrate 100. Then, a polysilicon film 105 with a thickness of 80 nm for forming a gate electrode and a protective-film formation film 106 with a thickness of 180 nm are deposited in this order by CVD over the entire surface of the semiconductor substrate 100 including the isolation region 101 and the gate-insulating-film formation film 104.

Next, as illustrated in FIG. 13B, the protective-film formation film 106 is patterned into the shape of a gate electrode in each of the first and second regions A and B by lithography and dry etching, thereby forming a first protective film 106A and a second protective film 106B out of the protective-film formation film 106. At this time, the width (gate length) of the second protective film 106B in the second region B is larger than that of the first protective film 106A in the first region A. Subsequently, using the first and second protective films 106A and 106B obtained by patterning as masks, dry etching is performed on the polysilicon film 105 and the gate-insulating-film formation film 104. In this manner, a first gate-electrode formation film 107A including the patterned first protective film 106A and a first polysilicon film 105A is formed in the first region A, whereas a second gate-electrode formation film 107B including the patterned second protective film 106B and a second polysilicon film 105B is formed in the second region B. At this time, a first gate insulating film 104A is formed out of the gate-insulating-film formation film 104 in the first region A, whereas a second gate insulating film 104B is formed out of the gate-insulating-film formation film 104 in the second region B. Subsequently, ion implantation using phosphorus (P) or arsenic (As) as an n-type dopant is performed such that shallow n-type source/drain doped layers 108 are formed in the first p-well 102 and the second p-well 103 with the first gate-electrode formation film 107A and the second gate-electrode formation film 107B used as masks.

Subsequently, as illustrated in FIG. 13C, a silicon nitride film is deposited by CVD to a thickness of 50 nm over the entire surface of the semiconductor substrate 100 including the gate-electrode formation films 107A and 107B. Then, anisotropic etching is performed on the deposited silicon nitride film, thereby forming sidewalls 109 of a silicon nitride film on both sides of each of the gate-electrode formation films 107A and 107B. Thereafter, ion implantation using phosphorus (P) or arsenic (As) is performed using, as masks, the gate-electrode formation films 107A and 107B provided with the sidewalls 109. Then, with heat treatment for activating the implanted impurity, deep n-type source/drain doped layers 110 are formed in the first p-well 102 and the second p-well 103 below the sides of the sidewalls 109 on the gate-electrode formation films 107A and 107B.

Then, as illustrated in FIG. 13D, a natural oxide film formed on the surfaces of the deep n-type source/drain doped layers 110 is removed. Then, a nickel film is deposited by sputtering to a thickness of 20 nm over the entire surface of the semiconductor substrate 100. Thereafter, first RTA is performed on the semiconductor substrate 100 at 320° C. in a nitrogen atmosphere, thereby causing silicon forming the semiconductor substrate 100 and nickel in contact with this silicon portion to react with each other. This changes upper portions of the deep n-type source/drain doped layers 110 into nickel silicide. Subsequently, the semiconductor substrate 100 is immersed in an etchant in which hydrochloric acid and a hydrogen peroxide solution are mixed, thereby removing unreacted nickel films remaining on at least the isolation region 101, the protective films 106A and 106B and the sidewalls 109. Thereafter, second RTA is performed on the semiconductor substrate 100 at a temperature of 550° C. that is higher than the first RTA. In this manner, low-resistance nickel silicide layers 111 are formed in respective upper portions of the deep n-type source/drain doped layers 110.

Thereafter, as illustrated in FIG. 13E, an interlayer insulating film 112 of a silicon oxide film is formed over the entire surface of the semiconductor substrate 100 to cover the gate-electrode formation films 107A and 107B. Thereafter, the interlayer insulating film 112 is planalized by CMP until the sidewalls 109 and the protective films 106A and 106B are exposed. Then, a first resist pattern 113G covering a middle portion in the gate length direction of the second protective film 106B and exposing both ends in the gate length direction of the second protective film 106B is formed by lithography.

Figure 14A:
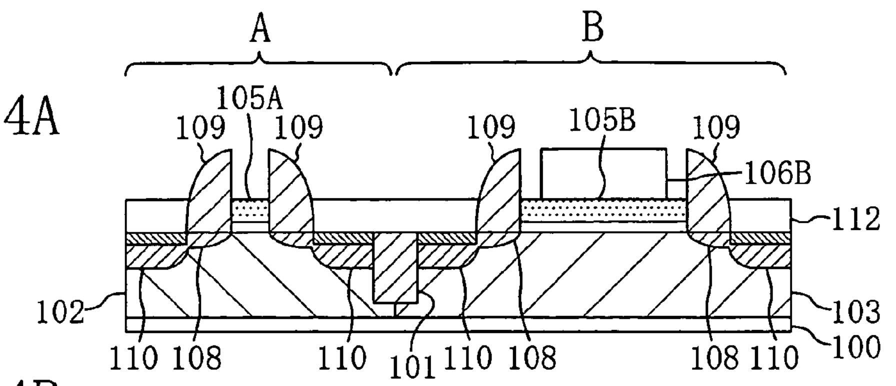
FIGS. 14A through 14E are cross-sectional views illustrating structures in respective process steps of the method for fabricating a semiconductor device according to the seventh embodiment in the order of fabrication.

Subsequently, as illustrated in FIG. 14A, the first protective film 106A and the second protective film 106B are etched under etching conditions having selectivities with respect to silicon nitride and polysilicon using the first resist pattern 113G as a mask so that the protective films 106A and 106B are removed, thereby exposing the first polysilicon film 105A and both ends of the second polysilicon film 105B in contact with the sidewalls 109. At this time, the second protective film 106B remains on the middle portion (i.e., a region except for the ends) of the second polysilicon film 105B. Thereafter, the first resist pattern 113G is removed.

Figure 14B:
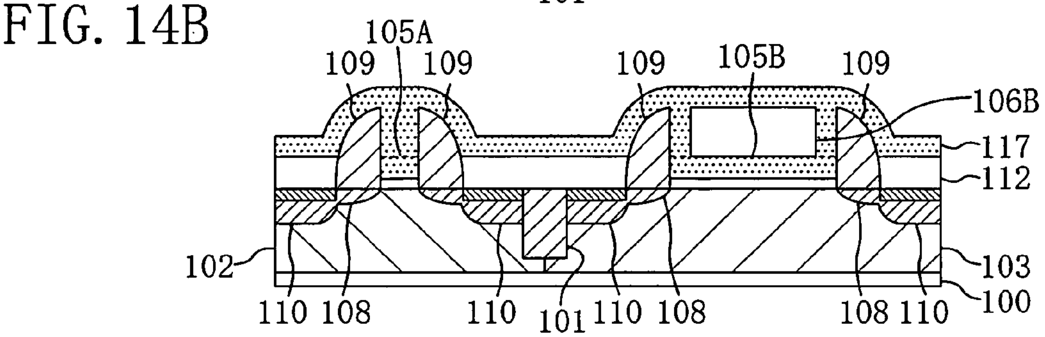
Figure 14C:
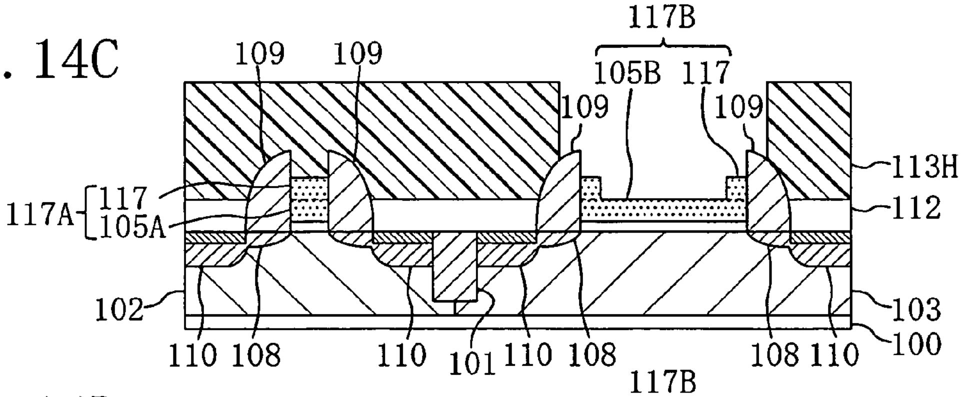

Then, as illustrated in FIG. 14B, a polysilicon film 117 is deposited by CVD to a thickness of 80 nm over the entire surfaces of the interlayer insulating film 112, the second protective film 106B and the sidewalls 109 including the exposed first and second polysilicon films 105A and 105B. Thereafter, the deposited polysilicon film 117 is etched back, thereby removing portions of the polysilicon film 117 located on the interlayer insulating film 112, the second protective film 106B and the sidewalls 109. In this manner, a first polysilicon film 117A is formed on the first gate insulating film 104A in the first region A and a second polysilicon film 117B is formed on the second gate insulating film 104B in the second region B. The first polysilicon film 117A is made of the stack of the first polysilicon film 105A and the polysilicon film 117 as illustrated in FIG. 14C. On the other hand, both ends in the gate length direction of the second polysilicon film 117B are made of the stack of the second polysilicon film 105B and the polysilicon film 117 and a middle portion of the second polysilicon film 117B is made only of the second polysilicon film 105B.

Thereafter, as illustrated in FIG. 14C, a second resist pattern 113H having an opening pattern for exposing the second protective film 106B is formed by lithography. Subsequently, using the second resist pattern 113H as a mask, the second protective film 106B is removed by etching under etching conditions having selectivities with respect to silicon nitride and polysilicon. Accordingly, the thickness of the first polysilicon film 117A in the first region A is larger than that of the middle portion of the second polysilicon film 117B in the second region B. In addition, since the polysilicon film 117 remains in the ends in the gate length direction of the second polysilicon film 117B, a cross section of the second polysilicon film 117B in the gate length direction has a recess.

Figure 14D:
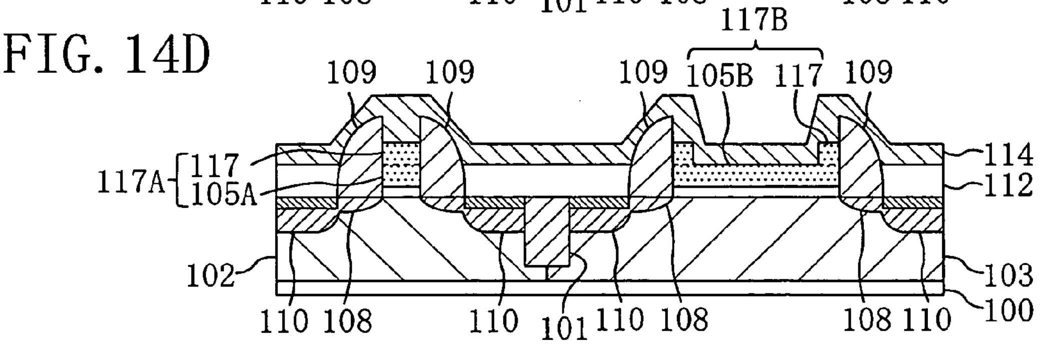
Figure 14E:
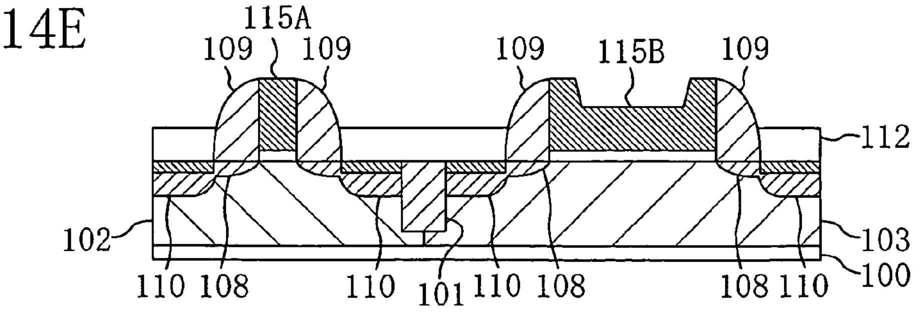

Thereafter, as illustrated in FIG. 14D, a metal film 114 of nickel is deposited by sputtering to a thickness of 50 nm over the entire surface including the interlayer insulating film 112, the sidewalls 109 and the polysilicon films 117A and 117B. Subsequently, third RTA is performed on the semiconductor substrate 100 at 400° C. in a nitrogen atmosphere to cause the polysilicon films 117A and 117B and the metal film 114 in contact with the polysilicon films 117A and 117B to react with each other, thereby fully siliciding the polysilicon films 117A and 117B. In this manner, as illustrated in FIG. 14E, a fully-silicided (FUSI) first gate electrode 115A and a FUSI second gate electrode 115B are formed in the first region A and the second region B, respectively.

As described above, in the seventh embodiment, the second polysilicon film 117B formed in the second region B is thinner than the first polysilicon film 117A formed in the first region A, so that the thickness ratio of the metal film 114 to the middle portion of the second polysilicon film 117B in the second region B is higher than those in conventional devices. Accordingly, no unreacted polysilicon region remains at least in the middle portion in the gate length direction of the second gate electrode 115B in the second region B, so that full silicidation is uniformly performed. As a result, variations in operation characteristics such as the threshold voltage caused by a remaining unreacted polysilicon region are suppressed.

In addition, as in the sixth embodiment, in the sixth embodiment, a portion of the polysilicon film 117 remaining after etch-back is formed in the ends of the second polysilicon film 117B in contact with the sidewalls 109. Accordingly, even if the thickness of the metal film 114 increases on the inner walls of the sidewalls 109, the thickness of the ends of the second polysilicon film 117B in contact with the sidewalls 109 remains in a substantially sufficient thickness range. Accordingly, an excessive supply of nickel atoms forming the metal film 114 near the sidewalls 109 is avoided during full silicidation of the second gate electrode 115B. This prevents a so-called metal-rich FUSI electrode from being formed in both sides of the second gate electrode 115B. As a result, variation of the gate resistance due to a nonuniform silicide composition in the second gate electrode 115B, thus obtaining desired transistor characteristics.

Embodiment 8

Hereinafter, a method for fabricating a semiconductor device according to an eighth embodiment of the present invention will be described with reference to the drawings.

FIGS. 15A through 15D illustrate cross-sectional structures in respective process steps of the method for fabricating a semiconductor device according to the eighth embodiment in the order of fabrication.

In the eighth embodiment, as a method for removing a first protective film and a second protective film to expose a first polysilicon film and a second polysilicon film, an interlayer insulating film and sidewalls are removed by CMP at a time, instead of a method for respectively removing the protective films by etching.

Figure 15A:
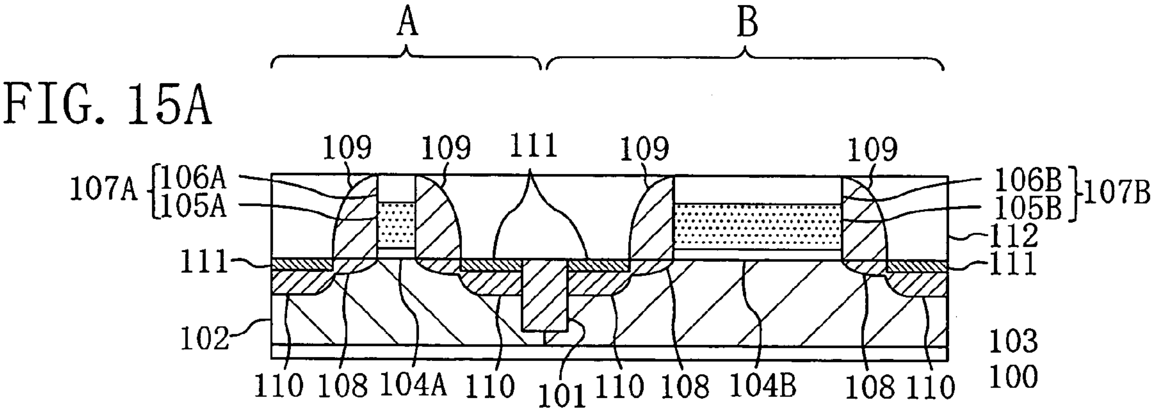
FIGS. 15A through 15D are cross-sectional views illustrating structures in respective process steps of a method for fabricating a semiconductor device according to an eighth embodiment of the present invention in the order of fabrication.

First, as in the first embodiment, FIG. 15A illustrates a state in which a first gate-electrode formation film 107A provided with sidewalls 109 on both sides thereof is formed in a first region A of a semiconductor substrate 100 and a second gate-electrode formation film 107B provided with sidewalls 109 on both sides thereof and having an area larger than the first gate-electrode formation film 107A is formed in a second region B of the semiconductor substrate 100. Shallow n-type source/drain doped layers 108 and deep n-type source/drain doped layers 110 are formed below both sides of the first gate-electrode formation film 107A in a first p-well 102 and below the second gate-electrode formation film 107B in a second p-well 103. Nickel silicide layers 111 are formed in upper portions of the deep n-type source/drain doped layers 110. The gate-electrode formation films 107A and 107B including the sidewalls 109 are buried in a planarized interlayer insulating film 112.

Figure 15B:
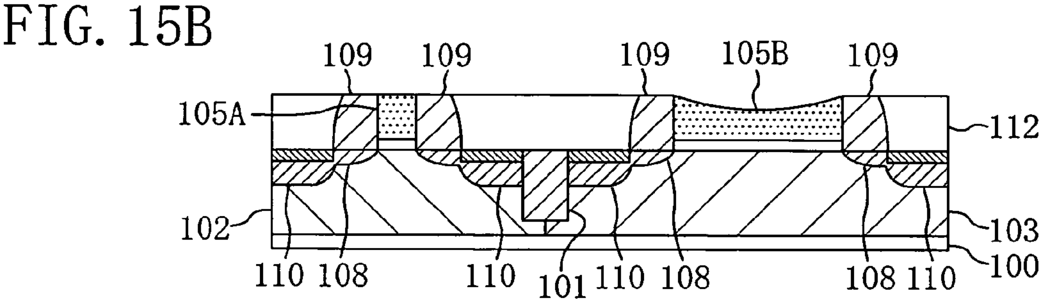

Next, as illustrated in FIG. 15B, the interlayer insulating film 112, the protective films 106A and 106B and the sidewalls 109 are polished by CMP until the polysilicon films 105A and 105B are exposed. At this time, CMP conditions under which so-called dishing is likely to occur, i.e., a middle portion in the gate length direction of the second polysilicon film 105B is likely to have a concave shape, in the second region are used. Accordingly, the second polysilicon film 105B in the gate length direction has a concave shape in cross section. More specifically, the second polysilicon film 105B is thick near the sidewalls 109 and is thin in the middle portion thereof in cross section.

Figure 15C:
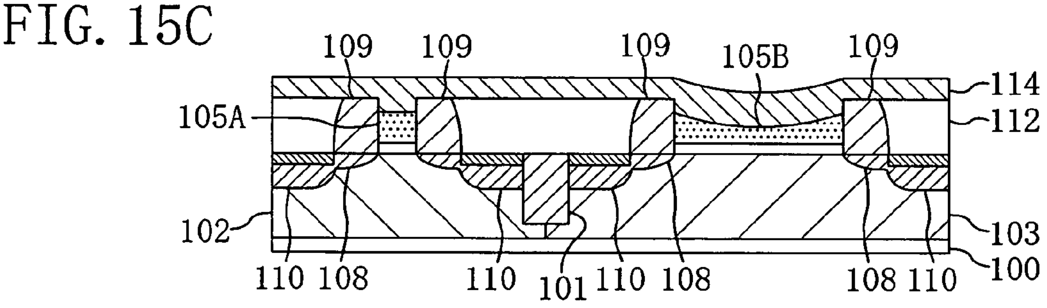
Figure 15D:
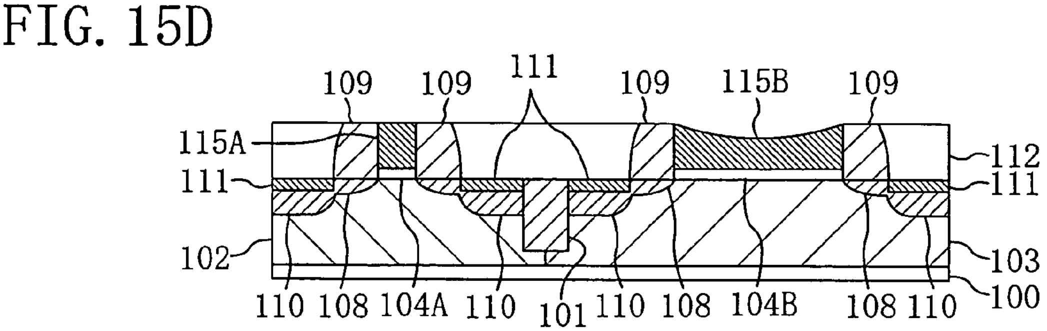
Figure 16:
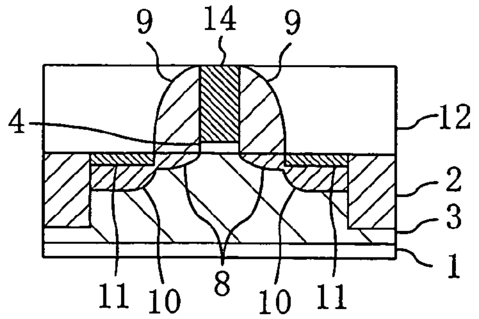
FIG. 16 is a cross-sectional view illustrating a structure of a conventional semiconductor device including a FUSI gate electrode structure.
Figure 17A:
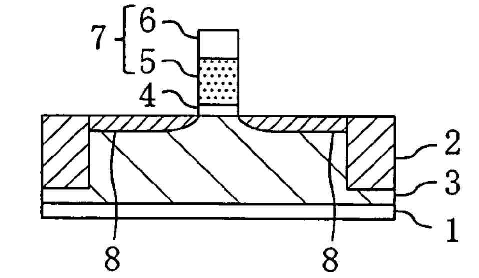
FIGS. 17A through 17D are cross-sectional views illustrating structures in respective process steps of a method for fabricating a conventional semiconductor device in the order of fabrication.
Figure 17B:
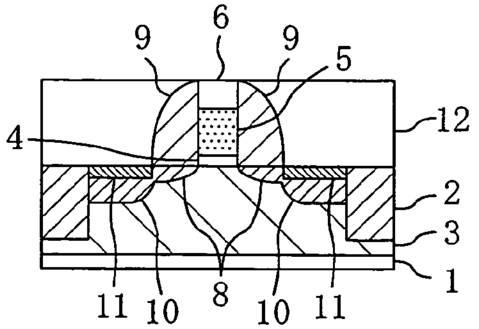
Figure 17C:
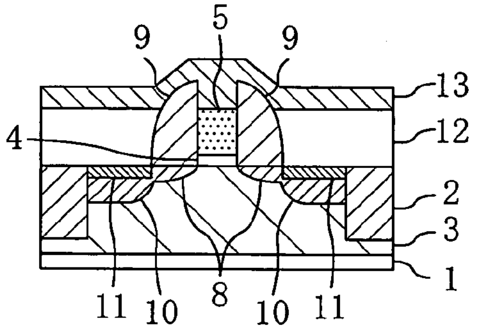
Figure 17D:
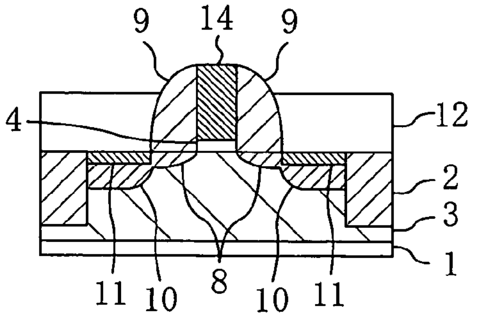
Figure 18A:
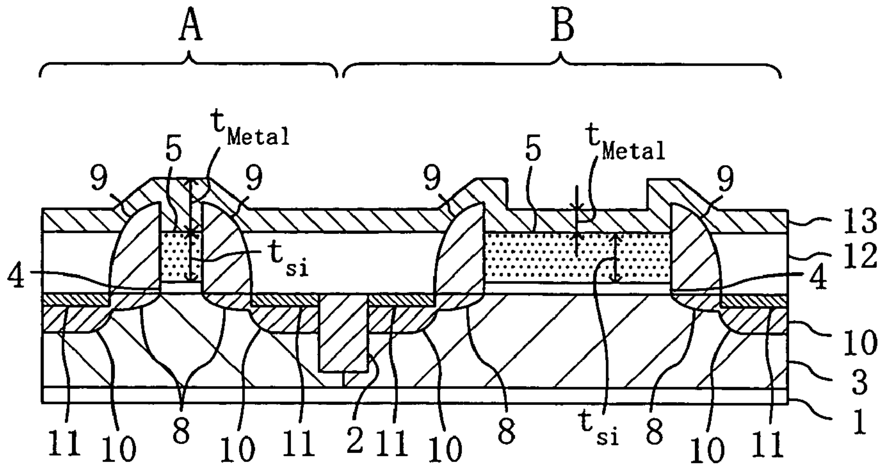
FIGS. 18A and 18B are cross-sectional views illustrating structures in respective process steps of a method for fabricating a conventional semiconductor device in the order of fabrication for describing problems.
Figure 18B:
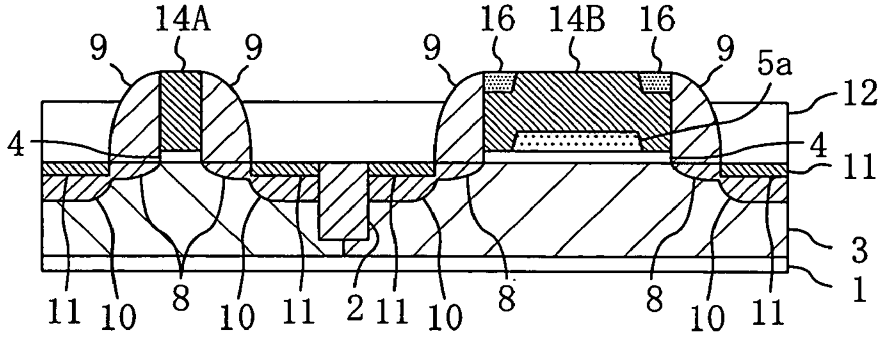

Then, as illustrated in FIG. 15C, the exposed first and second polysilicon films 105A and 105B are etched back under etching conditions having selectivities with respect to silicon oxide and silicon nitride. Thereafter, a metal film 114 of nickel is deposited by sputtering to a thickness of 50 nm over the entire surfaces of the interlayer insulating film 112, the sidewalls 109 and the polysilicon films 105A and 105B. Subsequently, RTA is performed on the semiconductor substrate 100 at 400° C. in a nitrogen atmosphere to cause the polysilicon films 105A and 105B and the metal film 114 in contact with the polysilicon films 105A and 105B to react with each other, thereby fully siliciding the polysilicon films 105A and 105B. In this manner, as illustrated in FIG. 15D, a fully-silicided (FUSI) first gate electrode 115A and a FUSI second gate electrode 115B are formed in the first region A and the second region B, respectively.

As described above, in the eighth embodiment, the second polysilicon film 105B formed in the second region B is thinner than the first polysilicon film 105A formed in the first region A by CMP dishing, so that the thickness ratio of the metal film 114 to the second polysilicon film 105B in the second region B is higher than those in conventional devices. Accordingly, no unreacted polysilicon region remains at least in a middle portion in the gate length direction of the second gate electrode 115B in the second region B, so that full silicidation is uniformly performed. As a result, variations in operation characteristics such as the threshold voltage caused by a remaining unreacted polysilicon region are suppressed.

In addition, in the eighth embodiment, the both ends of the second polysilicon film 105B in contact with the sidewalls 109 remain after CMP dishing. Accordingly, even if the metal film 114 is thick on the inner walls of the sidewalls 109, the thickness of portions of the second polysilicon film 105B in contact with the sidewalls 109 does not come to be insufficient, so that an excessive supply of nickel atoms forming the metal film 114 near the sidewalls 109 is avoided during full silicidation of the second gate electrode 115B. This avoids a metal-rich FUSI electrode from being formed in both ends of the second gate electrode 115B. As a result, variation of the gate resistance due to a nonuniform silicide composition in the second gate electrode 115B is suppressed, thus obtaining desired transistor characteristics.

In the first through eighth embodiments, polysilicon is used as a silicon material forming the gate-electrode formation films 107A and 107B. Alternatively, amorphous silicon or other semiconductor materials containing silicon may be used.

In the first through eighth embodiments, description is given on the cases of n-MISFETs. However, advantages are also obtained in the case of forming a p-MISFET in a similar manner. In this case, a first n-well and a second n-well are formed instead of the first p-well and the second p-well, respectively, and shallow p-type source/drain doped layers and deep p-type source/drain doped layers are formed instead of the shallow n-type source/drain doped layers and deep n-type source/drain doped layers, respectively.

In the foregoing embodiments, the nickel silicide layers 111 are formed in upper portions of the deep n-type source/drain doped layers 110. However, the metal for silicide is not limited to nickel, and metals for silicide such as cobalt, titanium or tungsten may be used.

The metal film 114 for siliciding the gate electrodes 115A and 115B is not necessarily made of nickel and may be made of platinum.

The sidewalls 109 are not necessarily made of silicon nitride and may be made of a stack of silicon oxide and silicon nitride.

In the foregoing embodiments, silicon oxide is used for the gate insulating films 104A and 104B. Alternatively, a film of a material having a high dielectric constant, i.e., a so-called high-κ film, such as hafnium oxide, hafnium silicate or zirconium oxide may be used, for example.

As described above, with a semiconductor device and a method for fabricating the device according to the present invention, it is possible to prevent an unreacted polysilicon region or a region having locally different silicide compositions from being formed in a gate electrode of a MIS transistor because of pattern dependence of, for example, the gate length or the gate area during full silicidation of the gate electrode. Accordingly, the present invention is useful for semiconductor devices having fully-silicided (FUSI) gate electrodes and methods for fabricating such devices.

What is claimed is:

1. A semiconductor device, comprising:

a semiconductor substrate divided into a first region and a second region;

a first MIS transistor formed in the first region of the semiconductor substrate and including a stack of a first gate insulating film and a fully-silicided first gate electrode; and a second MIS transistor formed in the second region of the semiconductor substrate and including a stack of a second gate insulating film and a fully-silicided second gate electrode, wherein the second gate electrode has a gate length larger than that of the first gate electrode, a middle portion in a gate length direction of the second gate electrode has a thickness smaller than the thickness of the first gate electrode, first sidewalls made of an insulating film are formed on both sides of the first gate electrode, second sidewalls made of an insulating film are formed on both sides of the second gate electrode, and a height of an upper surface of the middle portion in the gate length direction of the second gate electrode is lower than heights of upper ends of the second sidewalls, and heights of the second sidewalls measured from the surface of the second region are substantially identical with heights of the first sidewalls measured from the surface of the first region.

2. The semiconductor device of claim 1, wherein the second gate electrode has a flat upper surface.

3. The semiconductor device of claim 1, wherein the second gate electrode has a recess in cross section in the gate length direction.

4. The semiconductor device of claim 1, wherein the first MIS transistor has a first impurity layer formed in the first region below both sides of the first gate electrode, and the second MIS transistor includes a second impurity layer formed in the second region below both sides of the second gate electrode.

5. The semiconductor device of claim 1, wherein the first MIS transistor and the second MIS transistor are MIS transistors of an identical conductivity type.

6. A method for fabricating a semiconductor device, the method comprising the steps of:

(a) forming a gate insulating film, a silicon film and a protective film in this order over a semiconductor substrate divided into a first region and a second region;

(b) patterning at least the protective film and the silicon film, thereby forming a first gate-electrode formation film including a first protective film and a first gate silicon film formed out of the protective film and the silicon film, respectively, in the first region, and also forming a second gate-electrode formation film including a second protective film and a second gate silicon film formed out of the protective film and the silicon film, respectively, in the second region, the second gate-electrode formation film having a gate length larger than that of the first gate-electrode formation film;

(c) forming sidewalls of an insulating film on side faces of the first gate-electrode formation film and the second gate-electrode formation film;

(d) forming an impurity layer in the first region and the second region of the semiconductor substrate using, as masks, the first gate-electrode formation film and the second gate-electrode formation film provided with the sidewalls;

(e) removing the first protective film and the second protective film after the step (d), thereby exposing the first gate silicon film and the second gate silicon film;

(f) reducing the thickness of at least a middle portion in a gate length direction of the second gate silicon film so that the thickness is smaller than the thickness of the first gate silicon film, after the step (e); and (g) forming a metal film on the first gate silicon film and the second gate silicon film and then performing heat treatment on the metal film after the step (f), thereby fully siliciding the first gate silicon film and the second gate silicon film.

7. The method of claim 6, wherein in the step (f), etching is performed on the entire second gate silicon film so that the entire second gate silicon film has a thickness smaller than that of the first gate silicon film.

8. The method of claim 6, wherein in the step (f), only the middle portion in the gate length direction of the second gate silicon film is selectively etched so that the middle portion of the second gate silicon film has a thickness smaller than that of the first gate silicon film.

9. The method of claim 6, further comprising the step of forming an interlayer insulating film over the first region and the second region to cover the first protective film and the second protective film therewith and then planarizing an upper surface of the interlayer insulating film to expose upper surfaces of the first protective film and the second protective film, between the step of forming the impurity layer and the step of removing the first protective film, wherein an etch rate of the interlayer insulating film is lower than that of each of the first protective film and the second protective film.

10. The method of claim 6, further comprising the step of forming an extension impurity layer in the first region and the second region of the semiconductor substrate using the first gate-electrode formation film and the second gate-electrode formation film as masks, between the step of patterning the first gate-electrode formation film and the second gate-electrode formation film and the step of forming the sidewalls.

11. The method of claim 6, further comprising the step of siliciding an upper portion of the impurity layer, between the step of forming the impurity layer and the step of removing the first protective film.

* * * * *